(12) United States Patent
Ganachari

(10) Patent No.: US 10,895,871 B2
(45) Date of Patent: Jan. 19, 2021

(54) METHOD AND SYSTEM FOR AUTOMATICALLY GENERATING INTERACTIVE WIRING DIAGRAM IN AN INDUSTRIAL AUTOMATION ENVIRONMENT

(71) Applicant: Siemens Aktiengesellschaft, Munich (DE)

(72) Inventor: Mahantesh Ganachari, Bengaluru (IN)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 123 days.

(21) Appl. No.: 16/135,355

(22) Filed: Sep. 19, 2018

(65) Prior Publication Data
US 2019/0086902 A1 Mar. 21, 2019

(30) Foreign Application Priority Data
Sep. 19, 2017 (EP) .................................... 17191766

(51) Int. Cl.
*G05B 19/418* (2006.01)
*H04L 12/26* (2006.01)
(Continued)

(52) U.S. Cl.
CPC ..... *G05B 19/4188* (2013.01); *G05B 19/4184* (2013.01); *G05B 19/4185* (2013.01);
(Continued)

(58) Field of Classification Search
CPC ............ G05B 19/4188; G05B 19/4184; G05B 19/4185; G06F 30/18; H04L 41/0686; H04L 41/12
(Continued)

(56) References Cited

U.S. PATENT DOCUMENTS 6,912,671 B2 6/2005 Christensen
8,935,576 B2 1/2015 Dang
(Continued)

FOREIGN PATENT DOCUMENTS

DE 10328906 A1 1/2005
EP 2428861 A1 3/2012

OTHER PUBLICATIONS

"Trends in Factory Automation: The Internet of Things (IoT)," available at http://www.axiomtek.com/Download/Article/Download/trends_factory_automation_%20IoT_091115.pdf, pp. 1-20 (2015).

*Primary Examiner* — Suresh Memula
(74) *Attorney, Agent, or Firm* — Lempia Summerfield Katz LLC

(57) ABSTRACT

A method and system for automatically generating interactive wiring diagram in an industrial automation environment are disclosed. The method includes acquiring real-time data associated with devices commissioned in a plant from one or more sensing units disposed at the respective devices. The method also includes determining connections between the devices in the plant based on the acquired real-time data using a lookup table. The method includes generating a wiring diagram of the plant based on the determined connections between the devices. The wiring diagram represents the devices located in the plant and physical connections between the devices. The method includes dynamically generating interactive wiring diagrams by superimposing the wiring diagram with the device connectivity status information associated with respective connections between the devices.

17 Claims, 10 Drawing Sheets

(51) Int. Cl.
*H04L 12/24* (2006.01)
*G06F 30/18* (2020.01)

(52) U.S. Cl.
CPC .......... *G06F 30/18* (2020.01); *H04L 41/0686* (2013.01); *H04L 41/12* (2013.01); *H04L 41/22* (2013.01); *H04L 43/0811* (2013.01); *G05B 2219/25062* (2013.01); *G05B 2219/31356* (2013.01); *H04L 41/0677* (2013.01); *H04L 41/145* (2013.01); *H04L 41/147* (2013.01)

(58) Field of Classification Search
USPC ....................................................... 716/118
See application file for complete search history.

(56) References Cited

U.S. PATENT DOCUMENTS

2005/0210434 A1\* 9/2005 Rouch .................... G06F 30/18
716/102
2006/0190538 A1 8/2006 Hwang \* cited by examiner

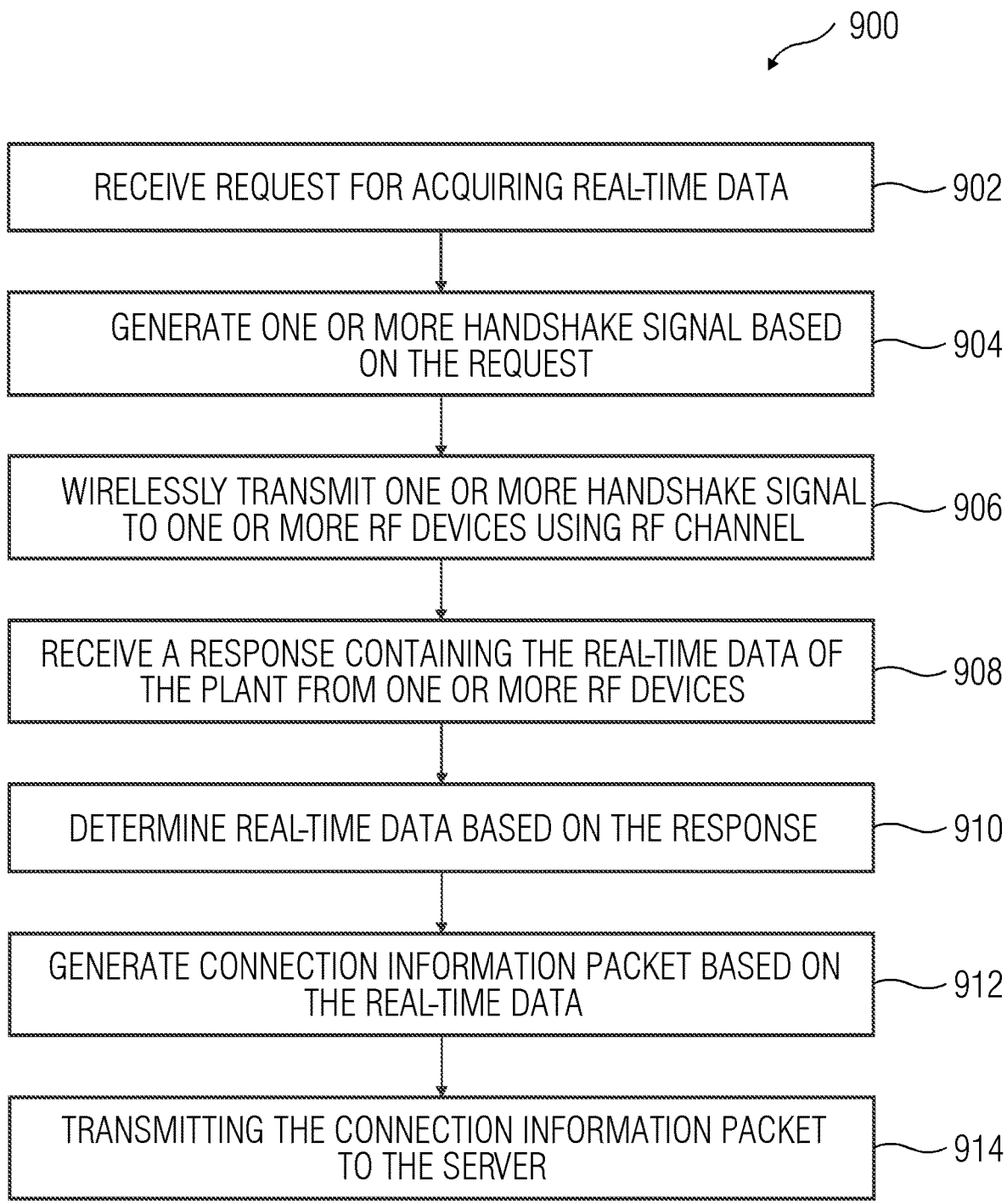

| CABLE/WIRE 1 ||Connection Status|
|---|---|---|
| RF Device 1 at first end | RF Device 2 at Second end | |
| Active | Active | Connection established |
| Faulty | Faulty | No connection established |
| Active | Faulty | No connection established |
| Faulty | Active | No connection established |

FIG. 10

| Control Panel ID | Sniffer Device ID | Cable ID | Cable Status | RF Device ID | RF Device Status | Signal Received | Temperature (degree Celsius) | Current |
|---|---|---|---|---|---|---|---|---|
| 00123 | 001256 | 001233 | Connected | 9876 | Active | YES | 25 | 60 |
| | | | | 9877 | Active | YES | 25 | 60 |
| | | 001234 | Connected | 9878 | Faulty | NO | 45 | 80 |
| | | | | 9899 | Active | YES | 25 | 60 |
| 00124 | 001257 | 002233 | NOT Connected | 9901 | Faulty | NO | 25 | 60 |
| | | 002224 | | 9902 | Faulty | NO | 45 | 65 |

FIG. 11

METHOD AND SYSTEM FOR AUTOMATICALLY GENERATING INTERACTIVE WIRING DIAGRAM IN AN INDUSTRIAL AUTOMATION ENVIRONMENT

PRIORITY CLAIM

This patent application claims the benefit of European Patent Application no. 17191766.9, filed on Sep. 19, 2017, which is hereby incorporated by reference in its entirety.

FIELD OF TECHNOLOGY

The present disclosure relates to industrial automation systems and more particularly relates to a method and system for automatically generating interactive wiring diagram in an industrial automation environment using real-time engineering data.

BACKGROUND

Typically in an industry, an automation system includes large number of hardware devices. These hardware devices are determined and designed manually by a set of engineers. The designing of the hardware devices of the plant is carried out using various types of engineering tools. One such tool enables an engineer to create plant layouts such as electrical CAD drawings, electrical wiring diagrams and so on manually. In specific, the electrical CAD drawings depict the electrical wiring/connections between each hardware devices of the plant. These electrical CAD drawings are later used as a reference by field operators while commissioning the plant. When once the plant commissioning is completed, and if there are any changes made to the design of the plant, such as if any wirings/connection is removed or changed, or if a new batch line is deployed, or a new device is added in the plant and so on, the field engineer has to manually update these electrical CAD drawings with the changes made to the design of the plant. This process of manual updating repeats every time a change is made to the design of the plant. In other words, there is a continuous need to repeatedly and dynamically revise the electrical CAD drawing for changes which arise in design of the plant and tracking the electrical CAD drawings every time a change is incurred in the design of the plant upon commissioning/during commissioning of the plant. As majority of these tasks are performed by humans using their knowledge, and experience, errors are made quite often. These errors can lead to injury or death to personnel, damage to plant device, loss in plant reliability, and downtime of the plant cannot be predicted thereby causing difficulty in planning a smooth production of the plant. There are currently no existing mechanisms to dynamically update the electrical CAD drawings during such changes in the design of the plant.

Additionally, these electrical CAD drawings are also used by the engineers/plant operators for maintaining the plants. In such scenarios, a field technician needs to manually identify faulty connections based on the electrical CAD drawings and diagnose the fault. Often, the field operator/technician has to access the cable lines during the operation of the plant which is difficult and dangerous to the life of the field operator. Hence, the manual diagnosis of the faulty component in the plant is time intensive, dangerous and requires often halting of the plant.

SUMMARY

A method and system for automatically generating interactive wiring diagram in an industrial automation environment using real-time engineering data is disclosed.

In one aspect, a method for automatically generating interactive wiring diagram in an industrial automation environment using real-time engineering data is disclosed. The method includes acquiring real-time data associated with devices commissioned in a plant from one or more sensing units disposed at the respective devices. The real-time data includes device information and device connectivity status information. The real-time data can be for example the electrical circuit connection information. Also, the real-time data can be wireless connection information. Alternatively, the real-time data may be physical connection information. The real-time data of the plant can be acquired wirelessly from the one or more sensing units. Alternatively, the real-time data can be acquired via an industrial Ethernet network from the one or more sensing units. The real-time data of the plant may indicate device identifiers, sensing unit identifiers, electrical wire/cable identifiers, process values of the plant, electrical wire/cable connection status and sensing unit status. Further, the one or more sensing units may be a radio frequency unit. Also, the one or more sensing units may be sniffer devices. Alternatively, the one or more sensing units may be a cable fault detecting sensor. The one or more sensing units may be physically attached to the respective devices commissioned in the plant. Alternatively, the one or more sensing units may be wirelessly connected to the respective devices commissioned in the plant.

The method further includes determining connections between the respective devices of the plant based on the acquired real-time data using a lookup table. For example, the connections between the respective devices of the plant may be electrical connections of the plant. Alternatively, the connections between the respective devices of the plant may be a wireless connection. The lookup table may indicate device identifiers, sensing unit identifiers, and electrical wire/cable identifiers. Moreover, the method includes generating a wiring diagram of the plant based on the determined connections between the respective devices of the plant. The generated wiring diagram includes the devices located in the plant and physical connections between the devices. The wiring diagram may be an electrical circuit diagram. Furthermore, the method includes dynamically generating an interactive wiring diagram by superimposing the wiring diagram with the device connectivity status information associated with respective connections between the devices. Additionally, the method includes displaying the generated interactive wiring diagram of the plant superimposed with the device connectivity status information on a graphical user interface.

The method includes identifying a fault in at least one connection in the plant based on the device connectivity status information of the at least one connection. Also, the method includes determining location of the fault in the at least one connection based on the device information. Additionally, the method includes computing at least one solution to rectify the fault in the at least one connection.

The method may include generating an alert indicating that the fault exists in the at least one connection. Further, the method includes displaying the fault in the at least one connection on the interactive wiring diagram of the plant. In one aspect of the preferred embodiment, in displaying the fault in the at least one connection on the interactive wiring diagram of the plant, the method includes displaying the location of the fault on the interactive wiring diagram, and the at least one solution to rectify the fault.

In determining the connections between the devices of the plant based on the acquired real-time data, the method includes selecting a source device from the devices commissioned in the plant based on the device information. Further, the method includes determining a target device connected to the source equipment using the lookup table. Additionally, the method includes determining the connection between the source equipment and the target equipment based on the real time data and the lookup table.

In acquiring the real-time data associated with the devices commissioned in the plant from the one or more sensing units disposed at the respective devices the method includes sending a request to the one or more sensing units disposed at the respective devices for providing real-time data associated with the respective devices via a wireless network. Further, the method includes receiving a response from the one or more sensing units, wherein the response includes the real-time data associated with the respective devices.

In another aspect, an apparatus for automatically generating interactive wiring diagram in an industrial automation environment is disclosed. In an embodiment, the apparatus may be a programmable logic controller (PLC). In another embodiment, the apparatus may include a human machine interface (HMI) or any other industrial devices known in the art. The apparatus may include a processor and a memory coupled to the processor. The memory includes an automation module stored in the form of machine-readable instructions executable by the processor.

The automation module is configured for acquiring real-time data associated with devices commissioned in a plant from one or more sensing units disposed at the respective devices. The real-time data includes device information and device connectivity status information. The automation module is further configured for determining connections between the devices in the plant based on the acquired real-time data using a lookup table. Also, the automation module is configured for generating a wiring diagram of the plant based on the determined connections between the devices. The generated wiring diagram represents the devices located in the plant and physical connections between the devices. Additionally, the automation module is configured for dynamically generating interactive wiring diagram by superimposing the wiring diagram with the device connectivity status information associated with respective connections between the devices. Moreover, the automation module is configured for displaying the generated interactive wiring diagram of the plant superimposed with the device connectivity status information on a graphical user interface.

In yet another aspect, a plant including one or more devices and one or more sensing units coupled to the one or more devices is disclosed. The one or more sensing units coupled to the one or more devices is configured for capturing real-time data associated with the one or more devices. The real-time data includes device information and device connectivity status information. Further, the plant includes an automation module communicatively coupled to the one or more sensing units. The automation module is configured for performing the method steps according to the embodiments described herein.

In yet another aspect, a cloud computing system is disclosed. The cloud computing system includes one or more processors connectable to one or more sensing units coupled to one or more devices in a plant via a gateway. The cloud computing system also includes a memory unit coupled to the one or more processors. The memory unit includes an automation module stored in the form of machine-readable instructions executable by the one or more processors. The machine-readable instructions cause the one or more processors to perform the method steps according to the embodiments described herein.

The above-mentioned and other features of the invention will now be addressed with reference to the accompanying drawings of the present disclosure. The illustrated embodiments are intended to illustrate, but not limit the invention.

BRIEF DESCRIPTION OF THE DRAWINGS

The present disclosure is further described hereinafter with reference to illustrated embodiments shown in the accompanying drawings, in which:

FIG. 9—is a process flowchart illustrating an exemplary method of acquiring real-time data of the plant from the one or more sniffer devices by an automation module via a communication network, according to an embodiment.

FIG. 10 is a table showing a connection status between two radio frequency devices such as those shown in FIG. 1 and FIG. 5, according to an embodiment.

FIG. 11 illustrates a connection information packet generated by a sniffer device such as those shown in FIG. 1 and FIG. 5, according to an embodiment.

DETAILED DESCRIPTION

Figure 1:
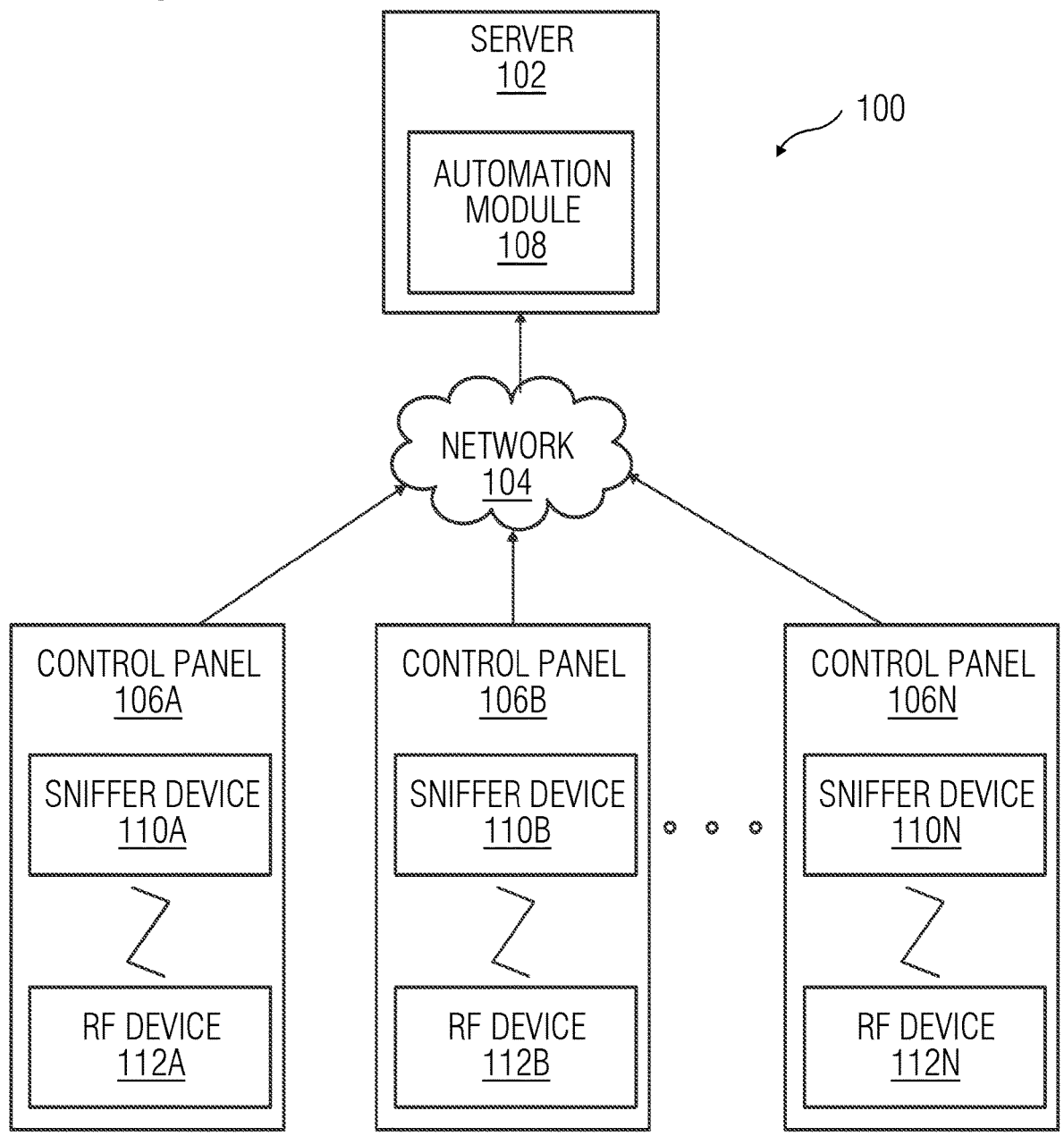
FIG. 1—is a block diagram of a process control system in an industrial plant, according to an embodiment.

A method and system for automatically generating interactive wiring diagram in an industrial automation environment using real-time engineering data is disclosed. Various embodiments are described with reference to the drawings, wherein like reference numerals are used to refer the drawings, wherein like reference numerals are used to refer to like elements throughout. In the following description, for the purpose of explanation, numerous specific details are set forth in order to provide thorough understanding of one or more embodiments. It may be evident that such embodiments may be practiced without these specific details.

The present disclosure provides an internet of things (IoT) based plant communication system for dynamically generating interactive wiring diagrams for the plant. The system uses radio frequency channels for capturing connection information of the plant and dynamically generating the interactive wiring diagrams for the plant based on the captured connection information. The present system uses radio frequency communications between one or more sniffer devices and one or more radio frequency (RF) devices, described below, for capturing the connection information of the plant. Throughout FIG. 1-FIG. 9, the sensing units are referred as comprising plurality of sniffer devices and a plurality of radio frequency devices. Further, the real-time data may be device information and device connectivity status information of the plant. For example, the device connection information may be electrical connection information and the connection may be the electrical connection between the respective devices of the plant. Furthermore, the wiring diagrams may be an electrical circuit diagram of the plant.

FIG. 1 is a block diagram of a process control system 100 in an industrial plant, according to an embodiment. The process control system 100 includes a server 102 and a plurality of control panels 106A-N. Each of the control panels 106A-N is connected to the server 102 via a communication network 104. The communication network 104 may be a wired (local area network, industrial Ethernet, etc) or wireless communication network. In an embodiment, the process control system 100 may be a cloud computing platform/system. The cloud computing system, such as process control system 100 can be part of public cloud or a private cloud. Although not shown, some or all of the devices in the process control system 100 can be connected to a cloud computing platform via a gateway. Also, the cloud platform can be connected to devices in plants located in different geographical locations.

Figure 2:
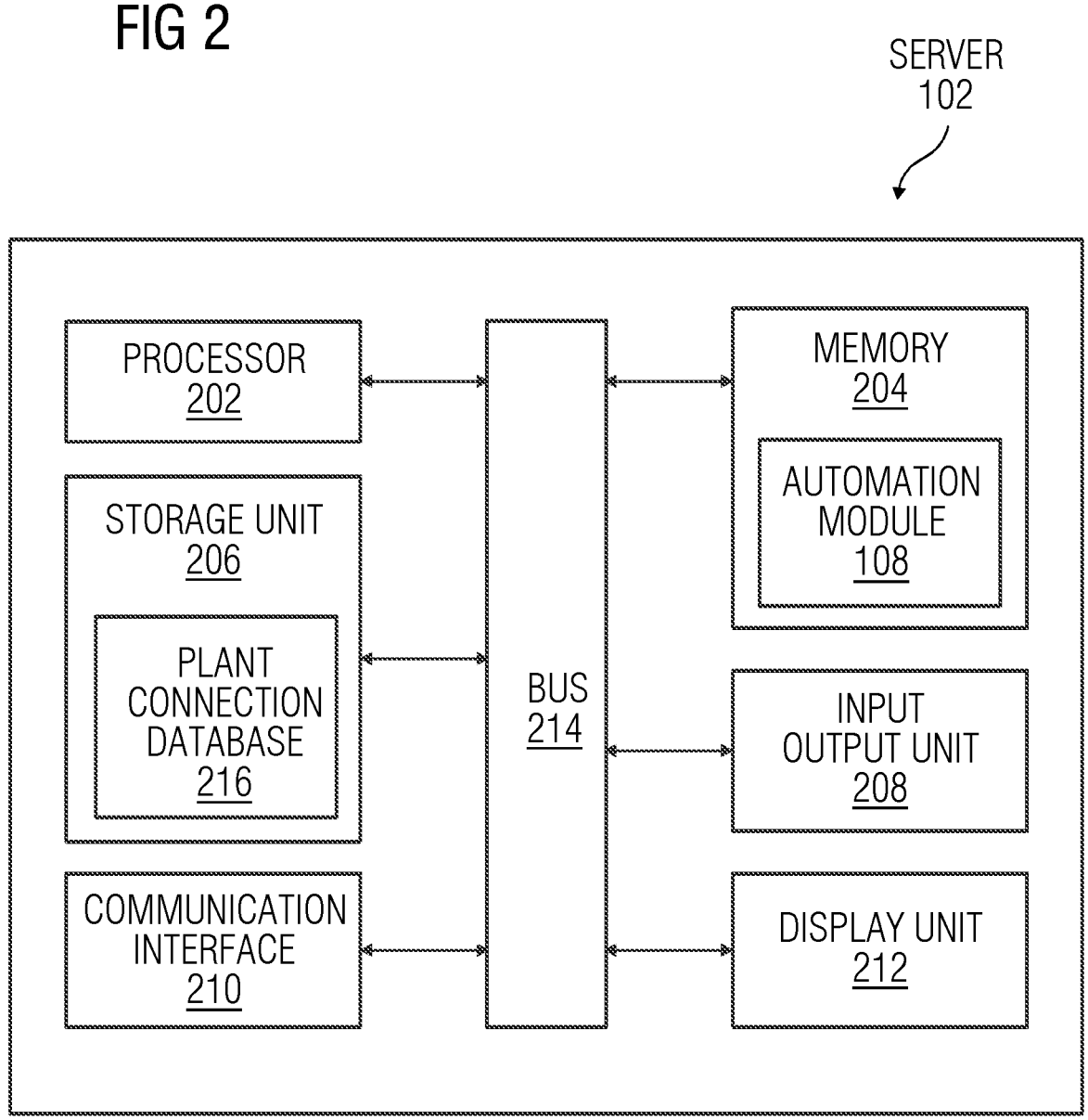
FIG. 2—is a block diagram of a server, such as those in shown in FIG. 1, showing various components to implement embodiments.

The server 102 includes an automation module 108. The server 102 may also include a processor, a memory, a storage unit, input output unit and a display unit. A detailed view of various components of the server 102 is shown in FIG. 2. The automation module 108 may be stored in the form of machine-readable instructions in the memory. The server 102 may be a standalone server or a server on a cloud. Further, the server 102 may be any kind of computing device such as those, but not limited to a personal computer, a notebook, a tablet, desktop computer, a laptop, a handheld device and a mobile device. Further, the server 102 may additionally include a configuration module (not shown) which assists the field engineers during commissioning of the plant. This configuration module may include a dedicated user interface for registering devices in the plant. Furthermore, the server 102 may include a device database for updating various external devices such as PLCs, field devices and so on.

When the machine readable instructions are executed, the automation module 108 causes the server 102 to acquire real-time data associated with devices commissioned in a plant from one or more sensing units disposed at the respective devices and determine connections between the devices in the plant based on the acquired real-time data using a lookup table. The real-time data includes device information and device connectivity status information. Further, the automation module 108 causes the server 102 to generate a wiring diagram of the plant based on the determined connections between the devices and dynamically generate interactive wiring diagram by superimposing the wiring diagram with the device connectivity status information associated with respective connections between the devices. The generated wiring diagram represents the devices located in the plant and physical connections between the devices. The interactive wiring diagram represents the device connectivity status information of the plant. The terms "server", "apparatus", "user device" and the "engineering station" are used interchangeably throughout the specification. The terms "electrical circuit diagrams" and "electrical CAD drawings" are also used interchangeably throughout the specification. Further, the terms "pre-stored connection table" and the term "look up table" are used interchangeably through the specification.

The plurality of control panels 106A-N includes one or more sensing units (110, 112). In an exemplary embodiment, the one or more sensing units (110, 112) may include a plurality of sniffer devices 110A-N and a plurality of radio frequency (RF) devices 112A-N. The plurality of sniffer devices 110A-N is wirelessly connected to the plurality of RF devices 112A-N. In an exemplary embodiment, every control panel 106 includes a sniffer device 110 and one or more RF devices 112. The terms "plurality of RF devices" and "RF devices" are used interchangeably throughout the specification. Further, the terms "plurality of sniffer devices" and "sniffer devices" are also used interchangeably throughout the specification.

In an embodiment, the plurality of sniffer devices 110A-N is configured for wirelessly capturing the real-time data associated with the one or more devices commissioned in the plant from the respective plurality of RF devices 112A-N. For example, the real-time data associated with the one or more devices commissioned in the plant may be device information and device connectivity status information of the plant. For example, the device information of the entire plant in general includes device-device electrical connection information, information on a new batch line upgraded in the plant, information on additional device added to the plant, status of the electrical connection information of the plant and the like. The device connectivity status information may include active electrical connection between devices, faulty electrical connections within the plant, a lost electrical connection and so on. Further, the plurality of sniffer devices 110A-N is configured for sending the real-time data of the plant to the server 102 via the communication network 104. The plurality of RF devices 112A-N senses the real-time data of the plant and transmits the sensed real-time data of the plant to the plurality of sniffer devices 110A-N. The detailed information on operation of the plurality of sniffer devices 110A-N is provided in FIG. 6 and FIG. 9.

The plurality of sniffer devices 110A-N may be an Ethernet sniffer or a wireless sniffer. In an exemplary embodiment, the plurality of sniffer devices 110A-N is connected to the server 102 via an Ethernet network 104. In another exemplary embodiment, the plurality of sniffer devices 110A-N is connected to the server 102 via a wireless communication network, such as, but not limited to Wi-Fi, wireless local area networks (WLANs), wireless sensor networks, and so on.

The plurality of RF devices 112A-N may be any kind of radio frequency identification devices for sensing and tracking each electrical wiring/connection of the plant. The plurality of RF devices 112A-N may be a passive device (i.e., does not include a battery and instead relies upon energy received by the antenna to induce a current that provides a voltage to operate RFID tag). The plurality of RF devices 112A-N is powered wirelessly with electromagnetic radio waves generated by the plurality of sniffer devices 110A-N. This is done by power harnessing chips known in the art. The chips harness the miniscule energy derived from the electromagnetic radio waves to derive the required voltage level for their operation. Each of this RF devices 112A-N is physically attached to electrical cable/wire(s) that connects one or more components in the plant. In other words, each electrical cable/wire(s) in the plant forming the connection network includes one such RF device, such as RF device 112, at each end of the electrical cable/wire(s). The terms "wires" and "cables" are used interchangeably throughout the complete specification. Hence, each electrical cable/wire(s) has two RF devices, such as the RF devices 112A-N, physically attached to the two ends of the electrical cable/wire(s). The RF devices 112A-N at each end of the electrical cable/wire(s) communicate with each other and transmit the real time data to the plurality of sniffer devices 110A-N. The RF devices 112A-N adheres to standard communication specifications known in the art. The detailed operation of the RF devices 112A-N with the plurality of sniffer devices 110A-N is explained in FIG. 7 and FIG. 9.

FIG. 2 is a block diagram of a server 102, such as those in shown in FIG. 1, showing various components to implement embodiments. The server 102 includes a processor 202, a memory 204, a storage unit 206, an input-output unit 208, a communication interface 210, a display unit 212, and a bus 214.

The processor 202, as used herein, may be one or more processing units (e.g., servers) capable of processing requests from the sensing units 110, 112, such as the plurality of sniffer devices 110A-N and the plurality of radiofrequency devices 112A-N. The processor 202 may also include embedded controllers, such as generic or programmable logic devices or arrays, application specific integrated circuits, or FPGAs (Field Programmable Gate Arrays and the like. The memory 204 may be volatile memory and non-volatile memory. The memory 204 includes an automation module 108 for dynamically generating interactive wiring diagram of the plant by superimposing the wiring diagram with the device connectivity status information associated with respective connections between the devices, according to one or more embodiments described herein. Memory elements may include any suitable memory device(s) for storing data and machine-readable instructions.

The automation module 108 may be stored in the form of machine-readable instructions on any of the above-mentioned storage media and may be executed by the processor 202. For example, a computer program may include machine-readable instructions which when executed by the processor 202, may cause the processor 202 to dynamically generate the interactive wiring diagram of the plant by superimposing the wiring diagram with the device connectivity status information associated with respective connections between the devices, according to the teachings and herein described embodiments of the present subject matter. In one embodiment, the program may be included on a compact disk-read only memory (CD-ROM) and loaded from the CD-ROM to a hard drive in the non-volatile memory.

The storage unit 206 includes a plant connection database 216 configured for storing real-time data of the plant. The communication interface 210 is configured for establishing communication sessions between the plurality of sniffer devices 110A-N and the server 102. The display unit 212 is configured for displaying the generated interactive wiring diagrams of the plant superimposed with device connectivity status information on a graphical user interface of the server 102. Further, the display unit 212 is configured for displaying general connection messages of the industrial plant. The bus 214 acts as interconnect between various components of the server 102. The component such as the input device 208 is well known to the person skilled in the art and hence the explanation is thereof omitted.

Figure 3:
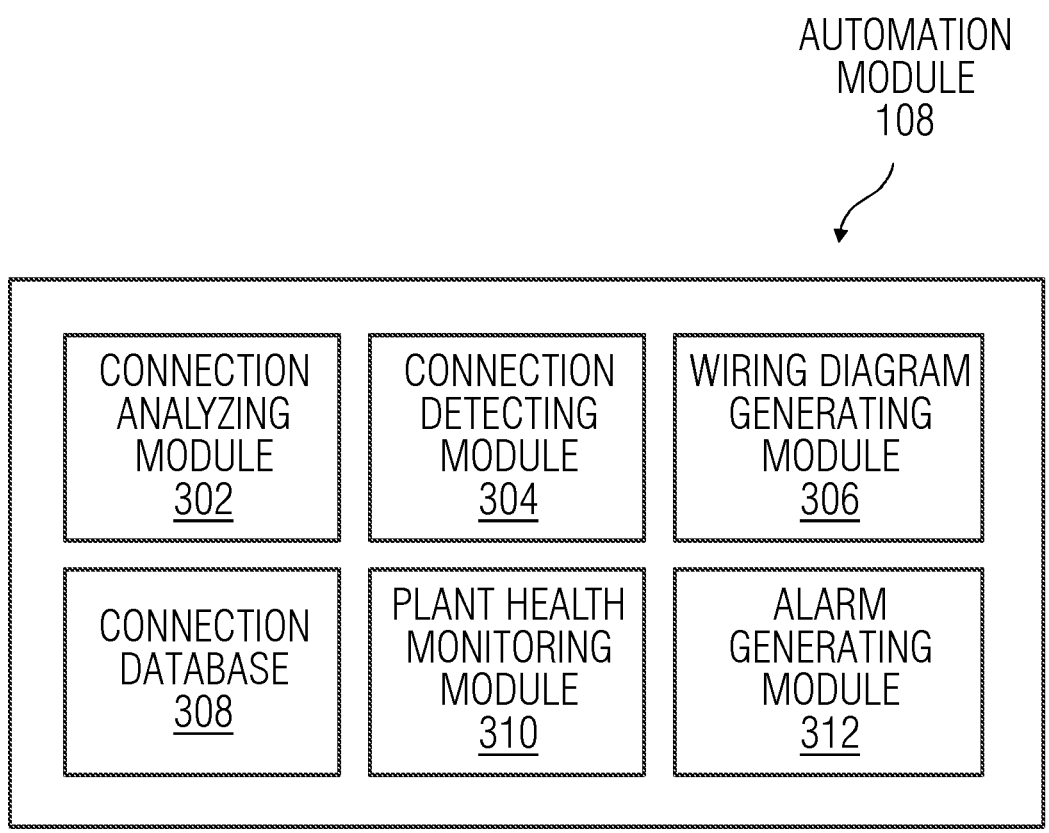
FIG. 3—is a detailed view of an automation module such as those shown in FIG. 1 and FIG. 2, according to an embodiment.

FIG. 3 is a detailed view of an automation module 108 such as those shown in FIG. 1 and FIG. 2, according to an embodiment. The automation module 108 includes a connection analyzing module 302, a connection detecting module 304, a wiring diagram generating module 306, a connection database 308, a plant health monitoring module 310 and an alarm generating module 312.

The connection analyzing module 302 is configured for acquiring real-time data associated with devices commissioned in the plant from the plurality of sniffer devices 110A-N via the communication network 104. The real-time data of the plant may include device information and device connectivity status information. The real-time data may be acquired in the form of plurality of connection information packets. Upon receiving this plurality of connection information packets, the connection analyzing module 302 extracts the content of each of the connection information packets and maps the content with a pre-stored connection table in the connection database 308. The content of the connection information packets of the plant may include, for example, but not limited to device identifiers (IDs) of each device in the plant, cable/wire(s) identifiers (IDs) of the plant, control panel identifiers (IDs) of the plant, sniffer device identifiers (IDs), RF device identifiers (IDs), connections between each device in the plant and connection status for each device in the plant. Upon mapping, the connection analyzing module 302 generates a single connection information data file/report for the entire plant. This single connection information data file/report is also known as the real-time data of the plant. The connection analyzing module 302, outputs the single connection information data file to the connection detecting module 304.

The connection detecting module 304 is configured to receive the analyzed single connection information data file as an input from the connection analyzing module 302. The connection detecting module 304 is then configured for determining connections between the devices (also referred as 'components) of the plant based on the single connection information data file using the lookup table (also referred as 'pre-stored connection table'). The connection detecting module 302 extracts the connection between each device in the plant and connection status for each device in the plant from the analyzed data file. The connection between each device in the plant provides information on how each device in the plant is connected to other device/devices in the plant through for example, electrical wires/cables. The information on how each device in the plant is connected includes a connection table having the entire device IDs of entire devices in the plant correspondingly mapped to the control panel IDs, the control panel IDs mapped to the corresponding plurality of sniffer device IDs and the plurality of sniffer device IDs mapped to the plurality of RF device IDs associated with each electrical cable/wire(s) in the plant. Further, the connection status for each device in the plant includes for example, information on status of each cable/wire(s) comprised in the plant. The status of each cable/wire(s) may include, but not limited to, an active connection, a lost connection, a faulty connection, a new connection, a removed connection, a modified connection, and a status corresponding to a process value associated with each cable/wire(s).

In an embodiment, the connection detecting module 302 is configured for selecting one among the plurality of devices as a source device based on the device information. Further, the connection detecting module 302 is configured for determining a target device connected to the source device by using the lookup table. Also, connection detecting module 302 is configured for determining the connection between the source device and the target device based on the single connection information data file and the lookup table as described above.

In a preferred embodiment, the connection detecting module 302 may be divided into three sub-modules, namely, a status detecting module, a fault detecting module and a process value detecting module. The status detecting module determines the device connectivity status information based on the analyzed data file of the real-time data. The status may include the active connection, the lost connection, the new connection, the removed connection and the modified connection of each cable/wire(s). The active connection indicates that the electrical cable/wire(s) is actively connected to respective pair of devices and is in proper working condition. The lost connection indicates that the electrical cable/wire(s) is not actively connected to the respective pair of devices and is not in a proper working condition. This could be because of a loose connection of the electrical cable/wire(s) between the respective pair of devices. The new connection indicates that a new electrical cable/wire(s) has been deployed in the plant due to a new requirement or a new device added to the plant. The removed connection indicates that the electrical cable/wire(s) connection between any pair of device has been removed due to new requirement or removal of devices in the plant. The modified connection of each cable/wire(s) may include the lost connection, the new connection and the removed connection in an embodiment. Additionally, the modified connection of the each cable/wire(s) may indicate if an existing connection between existing pair of devices has been modified where the existing cable/wire(s) originally connected to a pair of devices is now connected to new pair of devices and the like. In an embodiment, the connection detecting module 302 also determines the modifications made to the connections in the plant by comparing the real time connection information of the plant with pre-stored connection information in the connection database 308. On comparison, if there are any modifications identified in the connection of the plant, the status detecting module reports such changes to the wiring diagram generating module 306 as 'status reports'. Further, the status detecting module also reports the other status such as the active connection, the lost connection, the new connection, and the removed connection of each cable/wire(s) to the wiring diagram generating module 306 as 'status reports'.

The fault detecting module identifies the fault in the connection in the plant based on the analyzed data file of the real-time data. The fault may be due to a cable/wire(s) failure. The cable/wire(s) failure may be due to a worn-out cable/wire(s), insulation failure, and so on. In an embodiment, the fault detecting module identifies a fault in the connection in the plant based on the device connectivity status information of the connection. Also, the fault detection module determines location of the fault in the connection based on the analyzed data file of the real-time data.

In a preferred embodiment, the fault detecting module identifies these faults in the connection in the plant using the device connectivity status information. The device connectivity status information provides information on whether a signal from respective cable/wire(s) connecting each of these devices has been received or not along with the location of the respective cable/wire(s). If a signal from respective cable/wire(s) has not been received due to a hardware failure of the cable/wire(s), then the fault detection module identifies these faults and their respective location and reports them to the wiring diagram generating module 306 as 'fault reports'.

The process value detecting module determines the process values associated with each electrical cable/wire(s) and compares the determined process values with a pre-defined threshold value stored in the connection database 308. The process values of the lectrical cable/wire(s) may include a current value in ampere, a temperature value in degree. If the determined process value is equal to or below the pre-defined threshold value, then the process value detecting module reports the same as 'process value reports' with a general message as 'no action required' to the wiring diagram generating module 306. On the contrary, if the determined process value is above the pre-defined threshold value, then the process value detecting module immediately reports this determined process value along with a important message as 'immediate action required' to the wiring diagram generating module 306 as 'process value reports' and to the alarm generating module 312 for generating alarms for these determined process values. Hence, the connection detecting module 304 outputs the status report, the fault report and the process value report to the wiring diagram generating module 306.

The connection database 308 stores the real-time data acquired from the plurality of sniffer devices 110A-N. The connection database 308 also stores previous versions of wiring diagrams and interactive wiring diagrams generated by the wiring diagram generating module 306. Further, the connection database 308 also stores predefined threshold values for process values associated with each cable/wire(s) in the plant. Also, the connection database 308 stores entire connection network information of the plant such as the device IDs, the cable/wire(s) IDs, the control panel IDs, location information of each cable/wire(s) in the plant, alarms generated previously for the plant, historical data of the connection of the plant, and so on.

The wiring diagram generating module 306 is configured to generate wiring diagrams of the plant based on the determined connections between the devices. Further, the wiring diagram generating module 306 is also configured to dynamically generate an interactive wiring diagram by superimposing the wiring diagram with the device connectivity status information associated with respective connections between the devices. In an embodiment, the wiring diagram generating module 306 receive the status report, fault report and process value report of the connection of the plant from the connection detecting module 304. Upon receiving these reports, the wiring diagram generating module 306 generates a general wiring diagram and an interactive wiring diagram of the plant based on the status report, fault report and process value report of the connection of the plant. The generated general and interactive wiring diagrams may be for example electrical circuit diagrams, electrical wiring diagrams and the like. The general wiring diagram represents the devices located in the plant and physical connections between the devices. The dynamic interactive wiring diagrams of the plant shows the entire current connection of the plant depicting various devices in the plant, connections between each of these devices by the electrical cable/wire(s), and connection status of each of these electrical cable/wire(s). The connection network may be for example an electrical circuitry network or an industrial connection circuitry network or the like. For example, when the generated interactive wiring diagrams are the electrical circuit diagrams, the electrical circuit diagram of the plant highlights the exact electrical cable/wire(s) which is inactive or modified or faulty or has a process value more than the predefined threshold value. When a user of the server 102 points on the highlighted electrical cable/wire(s), the interactive wiring diagram generating module 306 pops out detailed information of connection for that electrical cable/wire(s). Since the interactive wiring diagram generated is real-time and is dynamic, the field operator or a commissioning engineer may process the commissioning of the plant without any error. For example, the electrical circuit diagram so generated is digital version of the current electrical circuit in the plant.

Further, the wiring diagram generation module 306 can detect all devices in the plant accurately and determine exact network connection status of the plant, for example, which cable is connected to which device and which port of the device and then generates live wiring diagrams, such as electrical circuit diagrams of the plant. Due to this, all connection disruptions in the plant can be easily identified and monitored and thus minimizes the downtime of the factory and the cost. Since the connection network of the plant is continuously monitored, physical health of the plant can be accurately determined. Any migration activities in the connection network of the plant reflect immediately in the interactive wiring diagram so generated.

The plant health monitoring module 310 is configured to receive the dynamically generated interactive wiring diagram from the wiring diagram generating module 306 as an input and uses the interactive wiring diagram for monitoring the connection of the plant. In an embodiment, the plant health monitoring module 310 periodically determines the status of the connection of the plant as depicted in the interactive wiring diagram and compares them with a pre-stored threshold values for the connection of the plant. For example, the plant health monitoring module 310 periodically compares the process values of each electrical cable/wire(s) of the plant with the pre-stored or pre-defined threshold value in the connection database 308 to monitor the health of the plant. If the plant health monitoring module 310 identifies any disturbance in the process values of each electrical cable/wire(s) of the plant, the plant health monitoring module 310 immediately reports them to the wiring diagram generating module 306 and the alarm generating module 312.

In such cases, the alarm generating module generates alarms (also referred as alerts) for the identified disturbances (or may be the faults in an embodiment) in the process value of the electrical cable/wire(s) and displays the generated alarms on the display unit, such as display unit 212 of the server 102. Further, the wiring diagram generating module 306 upon receiving such disturbances for the process values of the electrical cable/wire(s) re-generates the interactive wiring diagram on the fly by indicating the disturbance identified for the process value of the electrical cable/wire(s). Hence, in such cases, the interactive wiring diagrams are also generated based on the input from the plant health monitoring module 310. Further, during such scenarios, the wiring diagram generation module 306 may not wait until the real-time data is acquired from the plurality of sniffer devices 110A-N, but generates the interactive wiring diagram periodically based on the input from the plant health monitoring module 310.

In another embodiment, the plurality of sniffer devices 110A-N may send the real-time data of the plant periodically to the server 102 without waiting for a command/request to be sent to the plurality of sniffer devices 110A-N from the server 102. In such cases, the wiring diagram generating module 306 generates the interactive wiring diagram of the plant periodically based on the real-time data received periodically from the plurality of sniffer devices 110A-N. Hence, the interactive wiring diagrams may be generated in three scenarios namely, first case based on real-time data of the plant received from the plurality of sniffer devices 110A-N when the server 102 sends a request to the plurality of sniffer devices 110A-N, a second case where an input is received from the plant health monitoring module 310 on the disturbances identified in the process value of the electrical cable/wire and the third case when the plurality of sniffer devices 110A-N periodically sends the real-time data of the plant to the server 102 without receiving any request from the server 102.

The alarm generating module 310 is configured to generate an alert indicating that the fault exists in the at least one connection; and display the fault in the at least one connection on the interactive wiring diagram of the plant. In an aspect of the embodiment, the alarm generating module 310 is also configured for displaying the location of the fault on the interactive wiring diagram, and the at least one solution to rectify the fault. In a preferred embodiment, the alarm generating module 310 is configured to receive the dynamically generated interactive wiring diagrams of the plant from the wiring diagram generating module 306 and the disturbances identified in the process value of the electrical cable/wire from the plant health monitoring module 310 as inputs. Based on these inputs, the alarm generating module 310 identifies the electrical cable/wire causing such disturbance or for which a status of connection shows as lost or inactive or faulty and generates respective alarms for the electrical cable/wire(s) depicting the exact problem associated with the electrical cable/wire(s). Such problems may be due to faulty connection, disturbances identified in the process value or any other status which require immediate attention of the user. The alarms generated may be displayed based on the priority or in a hierarchical manner. The priorities of the alarms may be identified based on any known mechanisms in the art, such as machine learning or artificial intelligence. The alarms may also compute possible solution to rectify the fault on the at least one connection based on a historical data stored in the connection database 308 and display the possible solution on the interactive wiring diagram In an embodiment, the automation module 108 may be further configured to provide simulation in order for a user to visualize a virtual factory environment, the plurality of devices/components connected, and how the plurality of devices/components is wired. Further, the automation module 108 may provide diagnostic tests to determine if the connection network of the plant is working properly. Further, the automation module 108 may be configured to ensure network physical safety by routine verification tests for measuring the process values, such as current and temperature of the electrical cable/wire(s) to check if the process values are within pre-defined threshold values.

Figure 4:
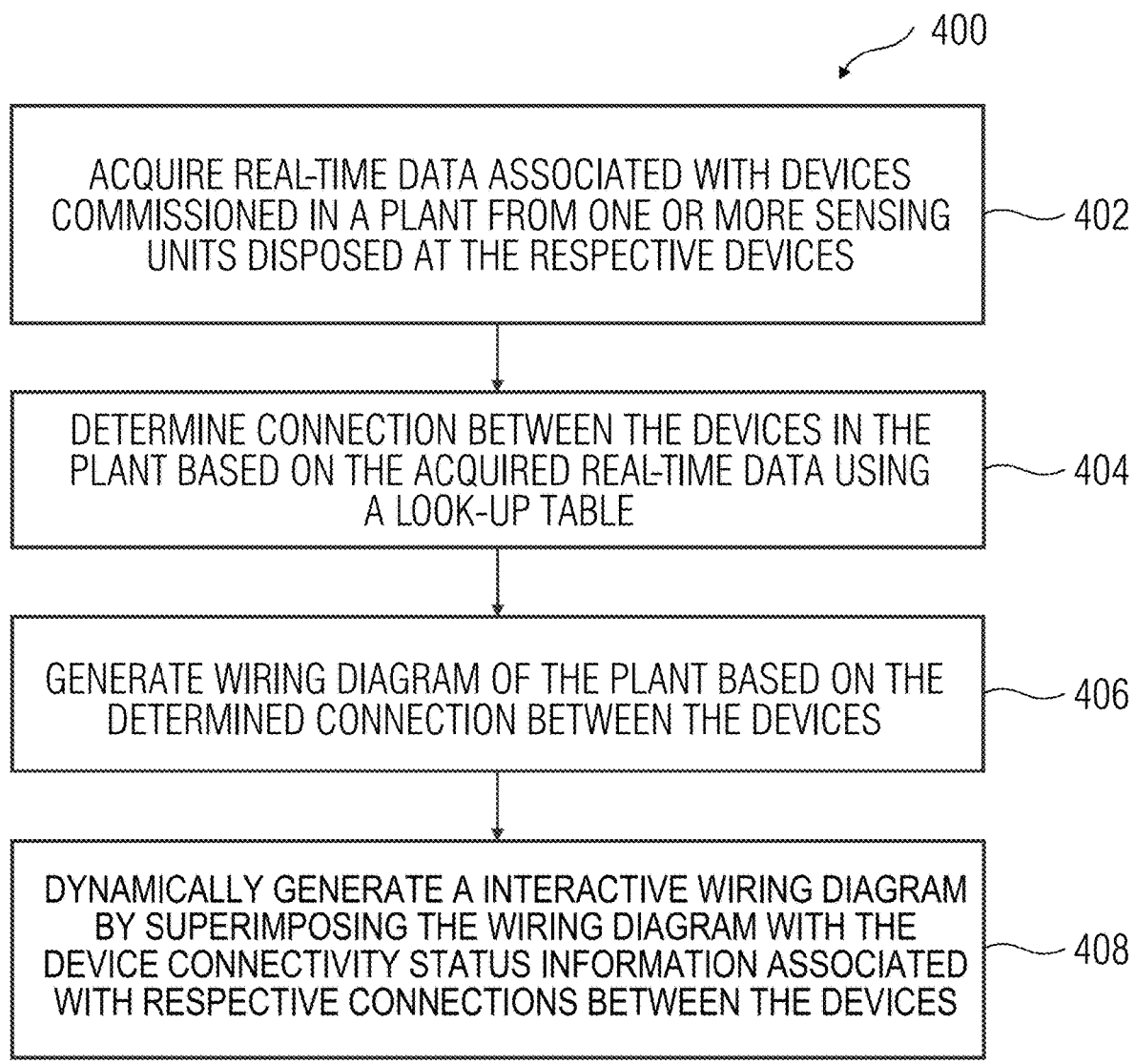
FIG. 4—is a process flowchart illustrating an exemplary method of dynamically generating interactive wiring diagrams of a plant, according an embodiment.

FIG. 4 is a process flowchart illustrating an exemplary method 400 of dynamically generating interactive wiring diagrams for a plant, according an embodiment. At step 402, real-time data associated with devices commissioned in the plant is acquired from one or more sensing units, such as the plurality of sniffer devices 110A-N and the plurality of radio-frequency device 112A-N disposed at the devices. The real-time data includes device information and device connectivity status information. At step 404, connections between the plurality of components/devices/devices of the plant are determined based on the acquired real-time data using the lookup table. At step 406, a wiring diagram of the plant is generated based on the determined connections between the plurality of components of the plant, where the generated wiring diagram represents the devices located in the plant and physical connections between the devices. At step 408, an interactive wiring diagram is dynamically generated by superimposing the wiring diagram with the device connectivity status information associated with respective connections between the devices. Furthermore, the interactive wiring diagrams are displayed on a graphical user interface, such as the display unit 212 of the server 102.

Figure 5:
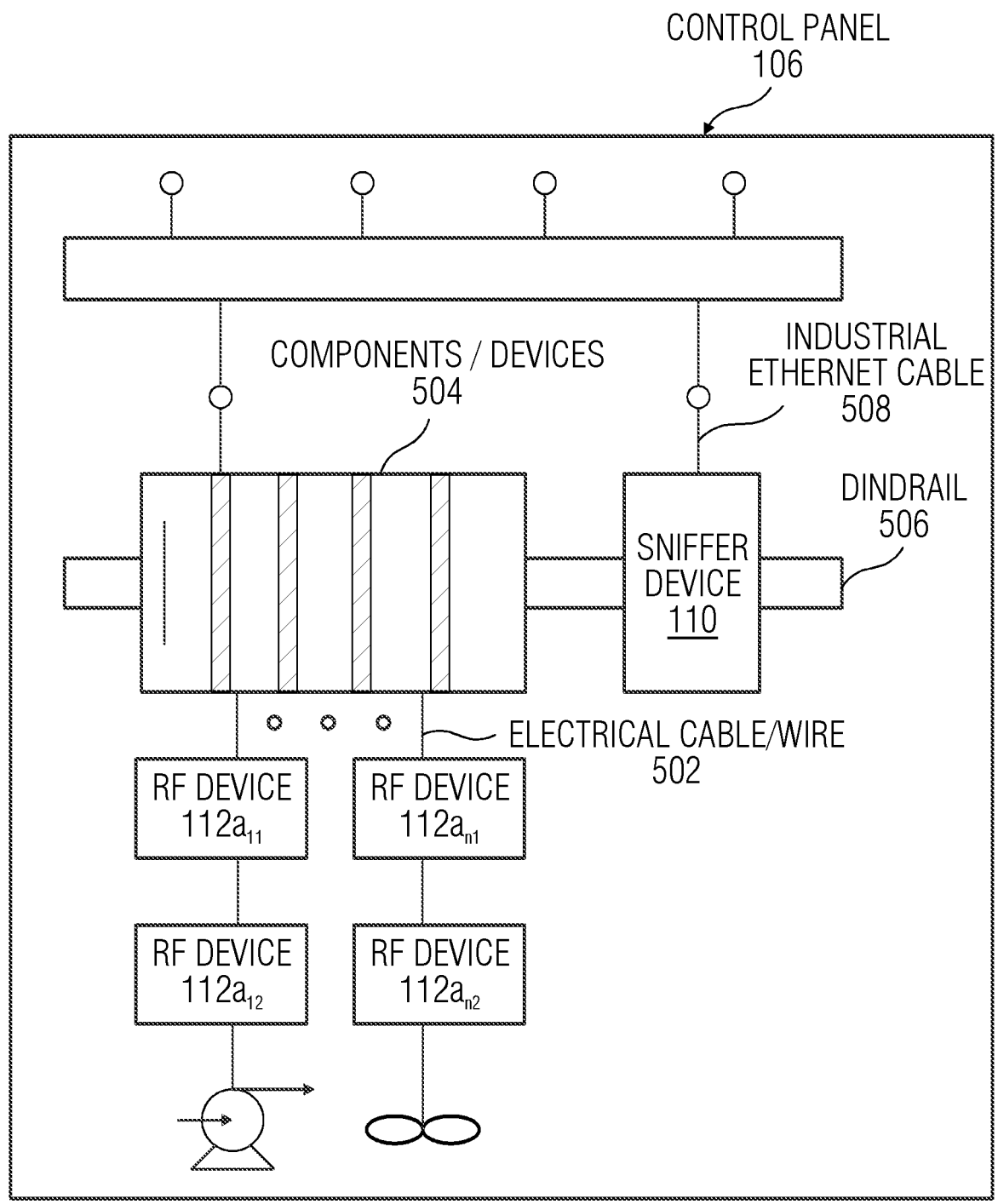
FIG. 5—is a schematic representation of a control panel such as those shown in FIG. 1, according to an embodiment.

FIG. 5 is a schematic representation of a control panel 106 such as those shown in FIG. 1, according to an embodiment. The terms "connection information" and the term "real-time data" are used interchangeably throughout the specification. The control panel 106 includes one or more electrical cable/wire 502 connecting plurality of components/devices 504 inside the control panel 106 with other components/devices 504 inside or outside the control panel 106. Each of the one or more electrical cable/wire 502 has a radio frequency (RF) device 112 physically attached to each end of the electrical cable/wire 502. In other words, every cable/wire 502 has two RF devices 112 physically attached to two ends of the cable/wire 502. For example, the RF device 112$a_{11}$ may be attached to first electrical cable/wire 1 and to the first end of the first electrical cable/wire 1 in the control panel 106. Similarly, the RF device 112$a_{n1}$ is attached to n$^{th}$ electrical cable/wire and to the first end of the n$^{th}$ electrical cable/wire of the control panel 106. Also, a RF device 112$b_{11}$ may be attached to a second control panel, say 106B, then and a RF device 112$c_{11}$ is attached to a third control panel, say 106C and so on. The plurality of RF devices 112A-N wirelessly communicates with nearest/proximate plurality of sniffer devices 110A-N via radiofrequency signals. The connections of the electrical cable/wire 502 are determined using a radiofrequency signal transmitted from the RF devices 112A-N to the sniffer devices 110. The RF devices 112A-N monitors the connection status of the electrical cable/wire 502 to which they are attached to and accordingly reports the connection status of the respective electrical cable/wire 502 to the sniffer device 110. Also, the RF device, say 112$a_{11}$ at one end of the electrical cable/wire(s) 502 communicate with RF device 112$a_{12}$ at the other end of the electrical cable/wire(s) 502 by inducing a electrical signal in the electrical cable/wire(s) 502 so that the other end RF device, say 112$a_{12}$, captures this electrical signal, generates a second electromagnetic signal and reports the second electromagnetic signal to the respective sniffer device, say 110A. By this, the RF devices 112 detect if the electrical cable/wire(s) 502 is cut in between. As the RF devices 112 induce the electrical signal in a specific pattern, the pattern received on the RF device 112 at the other end of the electrical cable/wire(s) 502 is also analyzed to determine if the electrical signal is received in the same pattern as desired which helps the respective sniffer device 110 assess on the number of electrical cable/wire(s) 502 from which the electro-magnetic signal is received thereby detecting even if a single electrical cable/wire(2) 502 is cut.

The sniffer device 110 is configured to constantly receive connection information (also referred as 'real-time data') of the respective electrical cable/wire(s) 504 from the RF devices 112. The sniffer device 110 is placed isolated on a din rail 506 from the plurality of components/devices 504. The sniffer device 110 communicates with the RF devices 112 wirelessly using one or more radio frequency signals and further communicates with the server 102 via an industrial ethernet cable 508. Since, the sniffer device 110 communicate wirelessly with the RF device 112, there is no need for electrically connecting the sniffer device 110 to the plurality of components/devices 504. Hence, there are no changes to be made to the current electrical network of the plant for deploying the sniffer devices 110 to implement the one or more embodiments of the present disclosure.

Each of the RF devices 112 in the control panel 106 has to initially register itself with the proximate sniffer device 110 by communicating an RF device ID and an electrical cable/wire(s) ID to the proximate sniffer device 110. This is a onetime registration. The sniffer device 110 stores the entire registered RF devices 112 with their respective RF device IDs in a database. Each time a new RF device 112 is added to the connection network of the plant, the new RF device 112 must initially register itself with the nearest/proximate sniffer device 110 in the manner as mentioned above. Additionally, when the registered RF device 112 is removed from the control panel 106 due to a change in connection, the sniffer device 110 updates this information accordingly in the database.

In an exemplary embodiment, the sniffer device 110 initially induces a first electro-magnetic handshake signal and transmits this induced first electro-magnetic handshake signal to the RF device, for example, 112$a_{11}$ using the standard RF communication protocols. This induced first electro-magnetic signal is also referred as 'handshake signal' or 'first radio frequency signal'. This induced first electro-magnetic handshake signal powers the RF device, say 112$a_{11}$. After the induced first electro-magnetic handshake signal is transmitted to the RF device 112$a_{11}$, there may be two scenarios occurring, one if the RF device 112$a_{11}$ has received this induced first electro-magnetic handshake signal from the sniffer device 110 and the other where the RF device 112$a_{11}$ has not received the induced first electro-magnetic handshake signal from the sniffer device 110.

Considering the first scenario, the RF device 112$a_{11}$ receives the first electro-magnetic handshake signal and gets powered up. In response to powering up, the RF device 112$a_{11}$ further induces an electrical signal within the RF device 112$a_{11}$ and transmits the electrical signal to the RF device 112$a_{12}$ through the electrical cable/wire(s) 502. Here again the RF device 112$a_{12}$ may or may not receive the electrical signal from the RF device 112$a_{11}$.

When the RF device 112$a_{12}$ receives the electrical signal from the RF device 112$a_{11}$, the RF device 112$a_{12}$ generates a second electromagnetic signal and reports a second electro-magnetic signal to the sniffer device 110. When once the sniffer device 110 receives this second electro-magnetic signal from the RF device 112$a_{12}$, the sniffer device 110 confirms that a connection has been established between the two RF devices, 112$a_{11}$ and 112$a_{12}$ of the same electrical cable/wire(s) 502. The second electromagnetic signal corresponds to the real-time data of the respective electrical cable/wire(s) 502.

In case, the RF device 112$a_{12}$ has not received the electrical signal from the RF device 112$a_{11}$, the RF device 112$a_{11}$ determines that the electrical signal has not been received by the RF device 112$a_{12}$ and reports this determination by a third electro-magnetic signal to the sniffer device 110. This determination may be made using a set of parameters such as length of the cable, usual time taken by the electrical signal to reach the RF device 112$a_{12}$ and so on. The sniffer device 110 then confirms that the RF device 112$a_{11}$ is active, however the RF device 112$a_{12}$ is inactive or faulty and that a connection between the two RF devices 112$a_{11}$ and 112$a_{12}$ of the electrical cable/wire(s) 502 has not been established.

In the second scenario, where the RF device $112a_{11}$ has itself not received the first electro-magnetic handshake signal from the sniffer device 110, the sniffer device 110 waits till a pre-defined period of time to determine if a response is received from either of the two RF devices $112a_{11}$ and the RF device $112a_{12}$. If the response is received back from the RF device $112a_{12}$ within the predefined period of time, then the sniffer device 110 confirms that a connection has been established between the two RF devices $112a_{11}$ and $112a_{12}$. In case, a response is not received from both of the RF devices $112a_{11}$ and $112a_{12}$ upon expiry of the predefined period of time, the sniffer device 110 confirms that a connection has not been established between the two RF devices $112a_{11}$ and $112a_{12}$. This may be due to the RF device $112a_{11}$ which has not received the first electro-magnetic handshake signal from the sniffer device 110 hence no electrical signal is transmitted between the two RF devices $112a_{11}$ and $112a_{12}$.

Alternatively, in case the response is not received from both the RF devices upon expiry of the predefined period of time, the sniffer device 110 transmits the first electromagnetic signal to the RF device $112a_{12}$ instead of the RF device $112a_{11}$. In this scenario, the RF device $112a_{12}$ communicates with the RF device $112a_{11}$ in the same manner as disclosed above in case of RF device $112a_{11}$. If the RF device $112a_{12}$ determines that the electrical signal has not been received by the RF device $112a_{11}$, then the RF device $112a_{12}$ reports this determination by a third electro-magnetic signal to the sniffer device 110. The sniffer device 110 then confirms that the RF device $112a_{12}$ is active, however the RF device $112a_{11}$ is inactive or faulty and that a connection between the two RF devices $112a_{11}$ and $112a_{12}$ of the electrical cable/wire(s) 502 has not been established.

The RF devices 112 wireless communicates with nearest sniffer device 110. Hence, any communications described in the complete specification between the RF devices 112 and the sniffer device 110 are to be understood as communications between the RF devices 112 and 'nearby/nearest/proximal' sniffer devices 110.

In another embodiment, the plurality of sniffer devices 110 in the plant communicates with each other through the communication network 104 for a seamless collaboration. For example, a sniffer device 110 may communicate with neighboring sniffer device 110 to obtain any information on plurality of RF devices 112 not registered with the sniffer device 110. Alternatively, when the sniffer devices 110 to which the plurality of RF devices 112 are registered is unavailable, the plurality of RF devices 112 are automatically directed to communicate with a neighboring sniffer device 110. During such scenarios, the neighboring sniffer device 110 may act as a home sniffer device 110 and wirelessly captures the real-time data of the plant from the plurality of RF devices 112. The neighboring sniffer device 110 may use a routing devices (not shown) located at specific points in the plant to obtain all the required information of the plurality of RF devices 112 such that the neighboring sniffer device 110 can actively communicate with the plurality of RF devices 112. The routing devices may help in achieving collaboration between the sniffer devices 110 of the plant. The sniffer devices 110 may communicate with the routing devices wirelessly, for example, through a Wi-Fi or through a RF channel. The routing devices may also be additional sniffer devices 110. These routing devices ensure active communication between any of the plurality of RF devices 112 with any of the sniffer devices 110 of the plant. The routing devices hold a copy of all required information stored in nearby sniffer devices 110. One routing device may be connected to 'n' number of sniffer devices 110. In this case, the one routing device holds the copy of all required information stored in the connected 'n' sniffer devices 110. When one among the 'n' sniffer device 110 fails, the routing device immediately pushes the required information stored on the failed sniffer device 110 to most nearby sniffer device 110 among the other 'n-1' sniffer devices 110. This ensures that there is no loss of data from the plurality of RF devices 112 and every information captured from the plurality of RF devices 112 are rightly obtained by the sniffer devices 110 and this information is actively communicated to the server 102 at any point of time.

The plurality of components/devices 504 may include programmable logic controllers (PLCs), input output modules and the like. The plurality of components/devices 504 in one control panel, say 106A are connected to a plurality of components/devices 504 in another control panel, say 106B via the electrical cable/wire(s) 502. In an exemplary scenario, if one end of the electrical cable/wire(s) connecting the device 504 is present in one control panel 106A, the other end of the electrical cable/wire(s) may connect to any other device 504 in another control panel 106B. In such scenarios, the RF device 112A attached to the first end of the electrical cable/wire(s) 502A may be registered to the sniffer device 110A residing in the same control panel, say 106A whereas the RF device 112B attached to the other end of the same electrical cable/wire(s) 502B may be registered to the corresponding sniffer device 110B residing in the other control panel, say 106B where the other end of the same electrical cable/wire(s) 502B exists.

The din rail 506 is a plate, such as a metallic plate for placing the plurality of components/devices 504 and the sniffer device 110. The industrial Ethernet cable 508 is used to connect the sniffer devices 110 with the server 102.

Figure 6:
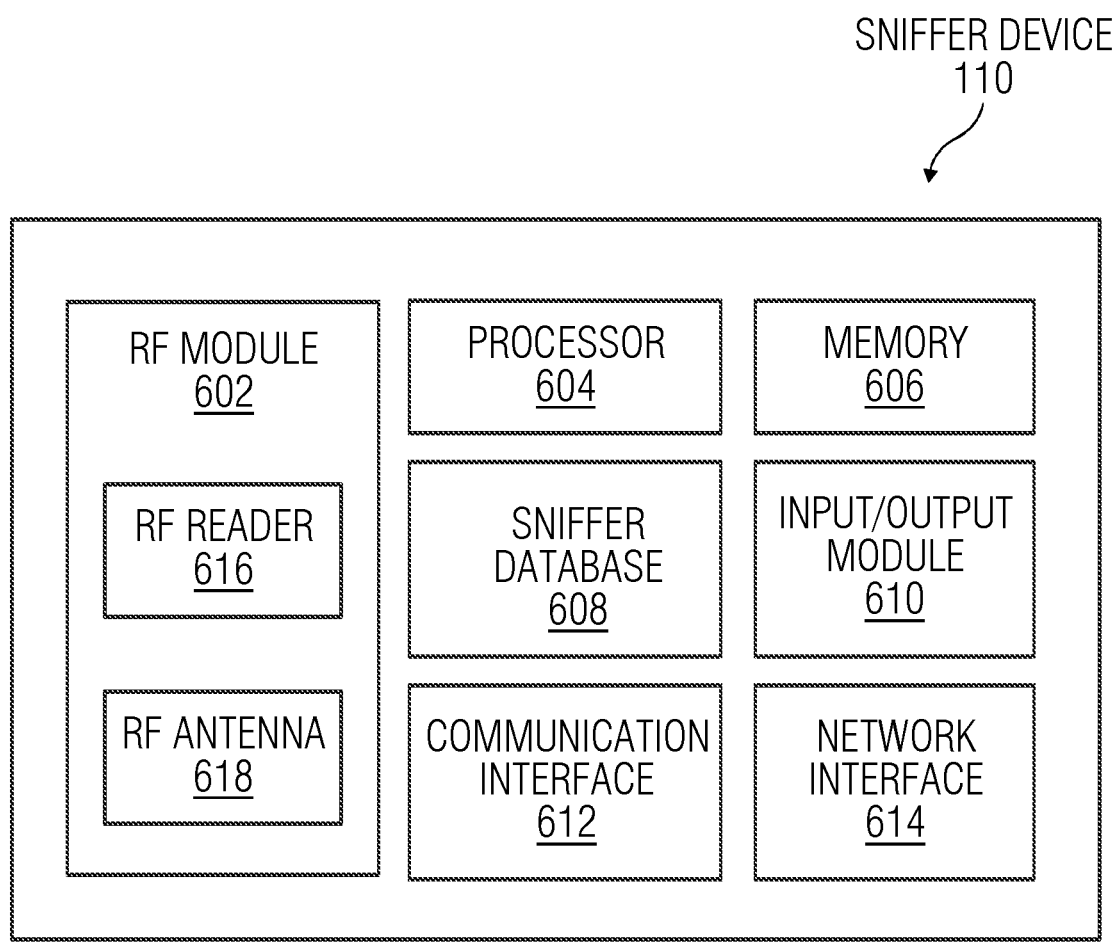
FIG. 6—is a detailed view of a sniffer device such as those shown in FIG. 1 and FIG. 5, according to an embodiment.

FIG. 6 is a detailed view of a sniffer device 110 such as those shown in FIG. 1 and FIG. 5, according to an embodiment. The sniffer device 110 includes a radio frequency (RF) module 602, a processor 604, a memory 606, a sniffer database 608, an input-output module 610, a communication interface 612, and a network interface 614.

The RF module 602 includes a RF reader 616 and a RF antenna 618. The RF reader 616 may include a transceiver. The RF antenna 618 may emit electromagnetic (EM) waves generated by the transceiver, which, when received by the RF devices 112, activates the RF devices 112. Once the RF devices 112 have been activated, the RF devices 112 may modify and reflect the waves back to the RF reader 616, thereby identifying the electrical cable/wire(s) to which the RF devices 112 are attached or are otherwise associated with. The RF reader 616 may be a hand held or stationary device that transmits a radio frequency signal that may be intercepted by the RF device 112. The RF reader 616 may transmit information via a wireless air interface to the RF device 112. The air interface enables the RF reader 616 to provide power, query data and/or timing information to the RF device 112 so that the RF device 112 may provide response data. Specifically, the RF device 112 may scavenge power from a received radio-frequency (RF) signal, and may backscatter the response data to the RF reader 616 by modulating an impedance of an associated antenna. For example, in a half-duplex communications arrangement, the RF reader 616 may modulate an RF waveform with information (e.g., bits). During a RF device-to-reader transmission, the RF reader 616 may transmit a Continuous-Wave (CW) radio signal. The RF device 112 may then backscatter-modulate the CW signal with bits to create a radio-frequency (RF) information waveform that is transmitted back to the RF reader 616. The RF reader 616 may include a memory (not shown) to store various algorithms and information, a core (e.g., a controller or processor) to control operations of the RF reader 616, and a front end, which is operatively coupled to the RF antenna 618, to control the transmission of information via the air interface and also to process real-time data received via the air interface by the RF antenna 618.

The RF reader 616 may be coupled (e.g., via a network 104) to a further processing system, such as the server 102. This may allow for programming and/or control of the RF reader 616 by the server 102. Further, the RF reader 616 may provide data, via the network 104, to the server 102 for a variety of purposes. For example, multiple RF readers 616 of the sniffer devices 110A-N may be coupled to a processing system, such as the server 102, so as to provide the server 102 with a comprehensive view of connection network of the plant. That is, multiple RF readers 616 of the sniffer devices 110 may be deployed at various locations within the plant.

Further, the RF reader 616 reads RF tags associated with each of the RF devices 112 that are within a particular range of the RF reader 616. This range is generally a function of the RF reader 616 and more particularly a function of the capabilities of the reader's antenna 618.

In general, the RF module 602 receives the request for obtaining real-time data of the plant from the server 102 and induces the first electromagnetic signal based on the request. Alternatively, the RF module 602 may periodically induce the first electromagnetic signal at predefined time intervals without waiting for the request to be received from the server 102. This first electromagnetic signal is transmitted from the RF module 602 of the sniffer device 110 to the registered RF devices 112. There could be four scenarios after which the first electromagnetic signal is transmitted to the registered RF devices 112, say for example the registered RF devices 112a1 and 112a2 of the same electrical cable/wire(s) 504. This is illustrated in FIG. 10. As seen from FIG. 10, the sniffer device 110 identifies whether a connection between the two RF devices 112a1 and 112a2 of the same electrical cable/wire 502 has been established or not based on the above information.

In case where both the RF devices 112a1 and 112a2 of the same electrical cable/wire(s) 502 are active, the first RF device 112a1 at first end of the electrical cable/wire(s) 502 receive the first electromagnetic signal, gets powered up, and in response induces a electrical signal which is then transmitted to the RF device 112a2 at the other end of the same electrical cable/wire(s) 502 in a specific pattern though the electrical cable/wire(s) 502. The RF device 112a2 at the other end of the same electrical cable/wire(s) 502 since it is active, receives the electrical signal in the specific pattern, generates a second electromagnetic signal and transmits the second electromagnetic signal to the RF reader 616 via the RF antenna 618. The second electromagnetic signal includes the connection status information of the electrical cable/wire(s) 502. Once the RF reader 616 receives the second electromagnetic signal from the RF device 112a2 at other end of the same electrical cable/wire(s) 502, the RF reader 616 confirms that a connection has been established between the two RF devices 112a1 and 112a2 of the same electrical cable/wire(s) 502.

In case where both the RF devices 112a1 and 112a2 of the same electrical cable/wire(s) 502 are faulty, the first RF device 112a1 at first end of the electrical cable/wire(s) 502 fails to receive the first electro-magnetic signal from the sniffer device 110 and thus fails to communicate with the second RF device 112a2 at second end of the electrical cable/wire(s) 502. In such cases, the sniffer device 110 waits till the pre-defined period of time to determine if a response is received back from either of the two RF devices 112a1 and 112a2. In case, a response is not received back from both of the RF devices 112a1 and 112a2 upon expiry of the predefined period of time, the sniffer device 110 confirms that a connection has not been established between the two RF devices 112a1 and 112a2. This may be due to the first RF device 112a1 which has not received the first electromagnetic handshake signal from the sniffer device 110 hence no signal is transmitted between the two RF devices 112a1 and 112a2 or vice versa. In the contrary case, where the response is not received back from both the RF devices 112a1 and 112a2 upon expiry of the predefined period of time, the sniffer device 110 transmits the first electro magnetic signal to the second RF device 112a2 instead of the first RF device 112a1 and waits till a response is received back from both the RF devices 112a1 and 112a2. If no response is received back again from both the RF devices 112a1 and 112a2 upon expiry of the predefined period of time, then the sniffer device 110 confirms that both the RF devices 112a1 and 112a2 are faulty and a connection between the two RF devices 112a1 and 112a2 has not been established as none of the RF devices 112a1 and 112a2 has received the first electromagnetic handshake signal.

In case where the first RF device 112a1 is active and the second RF device 112a2 is faulty, the first RF device 112a1 at first end of the electrical cable/wire(s) 502 receive the first electromagnetic signal, gets powered up, and in response induces the electrical signal which is then transmitted to the RF device 112a2 at the other end of the same electrical cable/wire(s) 502 in a specific pattern. The RF device 112a2 at the other end of the same electrical cable/wire(s) 502 since it is faulty, fails to receive the electrical signal from the first RF device 112a1. In this scenario, the first RF device 112a1 determines that the electrical signal has not being received by the second RF device 112a2 and reports this determination by a third electro-magnetic signal to the sniffer device 110. The sniffer device 110 then confirms that the first RF device 112a1 is active, however the second RF device 112a2 is inactive or faulty and that a connection between the two RF devices 112a1 and 112a2 of the electrical cable/wire(s) 502 has not been established.

In case where the first RF device 112a1 is faulty and the second RF device 112a2 is active, the first RF device 112a1 fails to receive the first electro magnetic signal from the sniffer device 110 and thus fails to communicate with the second RF device 112a2 at second end of the electrical cable/wire(s) 502. In such cases, the sniffer device 110 waits till the pre-defined period of time to determine if a response is received back from either of the two RF devices 112a1 and 112a2. In case, a response is not received back from both of the RF devices 112a1 and 112a2 upon expiry of the predefined period of time, the sniffer device 110 confirms that a connection has not been established between the two RF devices 112a1 and 112a2 and the sniffer device 110 transmits the first electro magnetic signal to the second RF device 112a2 instead of the first RF device 112a1 and waits till a response is received back from both the RF devices 112a1 and 112a2. In this scenario, the second RF device 112a2 communicates with the first RF device 112a1 in the same manner as disclosed above in case of first RF device 112a1 receiving the first electromagnetic signal. If the second RF device 112a2 determines that the electrical signal has not been received by the first RF device 112a1, then the second RF device 112a2 reports this determination by a third electro-magnetic signal to the sniffer device 110. The sniffer device 110 then confirms that the second RF device 112a2 is active, however the first RF device 112a1 is inactive or faulty and that a connection between the two RF devices 112a1 and 112a2 of the electrical cable/wire(s) 502 has not been established.

When once the RF reader 616 determines the connection status of each of connected the RF devices 112 in all the above scenarios, the RF reader 616 generates a connection information packet for the connected RF devices 112 in the following manner. The RF reader 616 first identifies all the cable ID and the RF device ID of all RF devices 112 which are wirelessly connected to the sniffer device 110. Further, the RF reader 616 identifies that the connection between the two RF devices, for example, 112a1 and 112a2 of the same electrical cable/wire(s) 502 has been established based on the second electromagnetic signal. Based on this identification, the RF reader 616 extracts the lookup table maintained at the sniffer database 608 to obtain the respective control panel ID within which the sniffer device 110 is resided, and the sniffer device ID. The RF reader 616 maps the connection status information of the electrical cable/wire 502 to the respective control panel ID and the sniffer device ID. The mapped connection status information of the electrical cable/wire 502 thus includes the respective RF device ID, the cable ID, RF device 112 status, the electrical cable/wire(s) 502 status, the respective control panel ID and the respective sniffer device ID. Additionally, the RF reader 616 also maps the process values identified by the RF devices 112 with the respective electrical cable/wire 502 which helps the server 102 identify the faulty electrical cable/wire 502. Upon mapping all the required information, the RF reader 616 in communication with the processor 604 generates a connection information packet for that electrical cable/wire(s) 502 which is then transmitted to the server 102 for generating the wiring diagram. This process is carried out for all the electrical cable/wire(s) in the plant, where every sniffer device 110 obtains real-time data of every electrical cable/wire(s) 502 and transmits the real-time data to the server 102. In specific, the real-time data of the plant includes the connection information packets received from plurality of sniffer devices 110A-N. In an alternate embodiment, the connection information packets are transmitted to the server 102 periodically at the predefined time intervals. FIG. 11 depicts an exemplary connection information packet generated by the sniffer device 110.

The sniffer device 110 generates the connection information packet containing the above mentioned information, as shown in FIG. 11. The connection information packet has control panel IDs of all the control panels 106A-N in the plant mapped to corresponding sniffer device IDs of all the sniffer devices 110A-N. This mapping shows that each control panel 106 has at least one sniffer device 110 resided within it. Each sniffer device IDs are mapped to corresponding electrical cable/wire(s) IDs of all electrical cable/wire(s) 502 residing within each of the control panels 106A-N. Each of these electrical cable/wire(s) IDs are further mapped to the corresponding RF device IDs of all the RF devices 112A-N attached to the each of these electrical cable/wire(s). Further, the RF device IDs are also mapped to the corresponding sniffer device IDs of sniffer devices 110A-N with which the RF devices 112A-N are registered.

In an alternate embodiment, the generated connection information packet may include the electrical cable/wire(s) ID, the RF device ID and the sniffer device ID. That is, the sniffer device 110 may add the sniffer device ID to the connection information, having the electrical cable/wire(s) ID, and the RF device ID received from the RF devices 112, in the connection information packet. When this connection information packet is transmitted to the server 102, the server 102 may determine the electrical cable/wire(s) status, the RF device 112 status, the process value status, and the control panel ID based on the connection information packet received from the sniffer devices 110A-N. Upon this determination, the server 102 may dynamically generate the wiring diagram for the plant. Further, the server may then superimpose the device connectivity status information of the plant with the wiring diagram to dynamically generate an interactive wiring diagram of the plant.

The processor 604 may be similar to processor 202 as described in FIG. 2. The processor 604 is capable of processing requests from the server 102 and the plurality RF devices 112A-N. The memory 606 may be volatile memory and non-volatile memory. The memory 606 may be similar to memory 104 as described in FIG. 2. The sniffer database 608 maintains a lookup table for updating the connection information received from each of the RF devices 112 connected to the sniffer device 110. Whenever the sniffer device 110 receives the connection information in the form of second electromagnetic signal or a third electromagnetic signal from the RF devices 112, the sniffer device 110 updates the lookup table with the connection information received from the RF devices 112. Even if the sniffer device 110 does not receive any information from the RF devices 112 due to faulty RF devices 112, the sniffer device 110 updates the lookup table accordingly indicating that respective RF devices from which the response is not received as faulty or inactive and thus indicating that the connection has not been established. This lookup table is further used by the RF module 602 for generating the connection information packet as described above.

The input-output module 610 may act as a transceiver for receiving and transmitting the connection information between the plurality of RF devices 112A-N and the server 102. The communication interface 612 is configured for wirelessly communicating with the plurality of RF devices 112A-N and the server 102. The network interface 614 helps in managing network communications between the RF devices 112A-N and the server 102.

Figure 7:
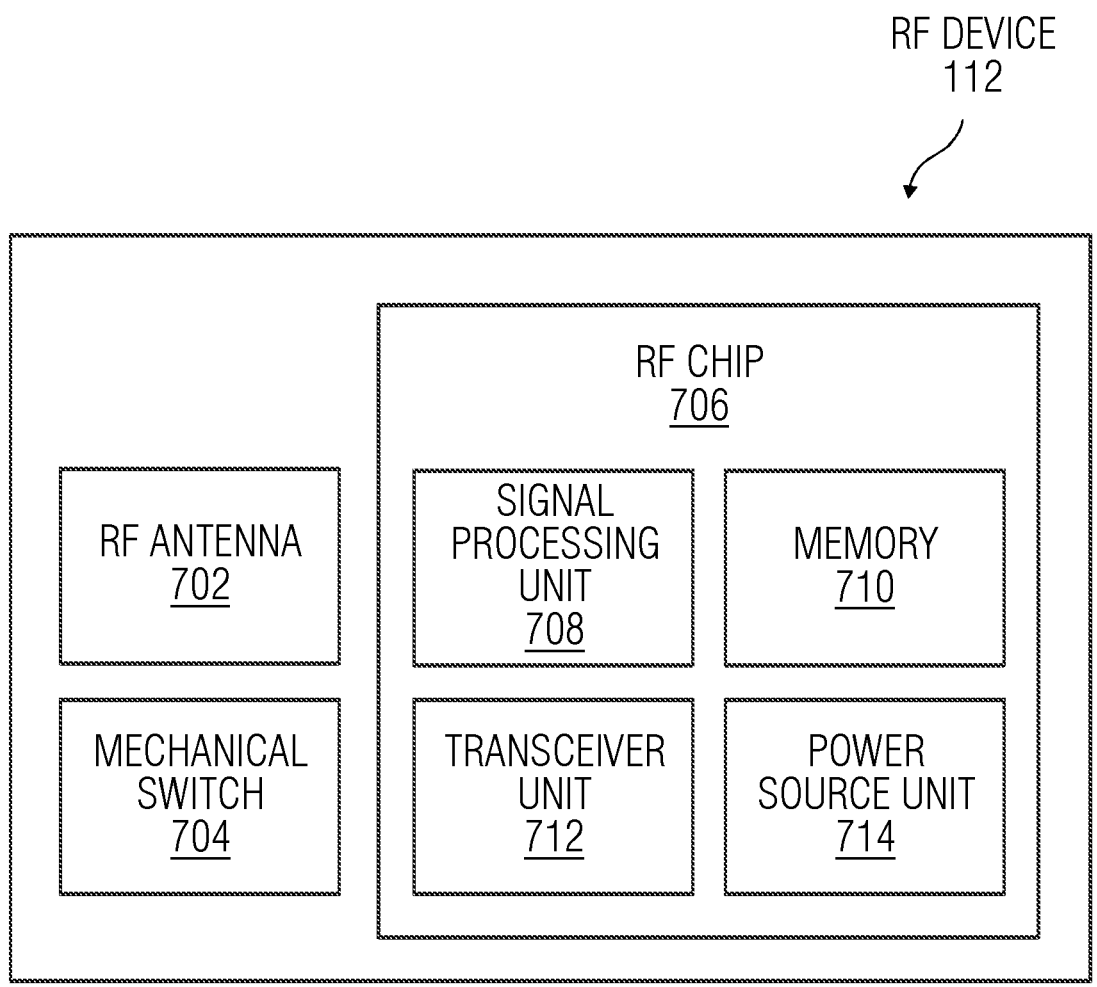
FIG. 7—is a detailed view of a radio frequency device such as those shown in FIG. 1 and FIG. 5, according to an embodiment.

FIG. 7 is a detailed view of a radio frequency (RF) device 112 such as those shown in FIG. 1 and FIG. 5, according to an embodiment. The RF device 112 includes an RF antenna 702, a mechanical switch 704 and a RF chip 706.

The RF antenna 702 may be a transmit/receive RF antenna configured to transmit RF electromagnetic signals at one time of operation and to receive RF electromagnetic signal at another time/same time of operation. The RF antenna 702 may include a directional antenna, an array antenna or an omni-directional antenna for RF signals. The RF antenna 702 is configured for receiving first electromagnetic signals from the proximate sniffer devices 110 and feeding these first electromagnetic signals to the RF chip 706 as an input. The RF antenna 702 is further configured for transmitting the second electromagnetic signals and the third electromagnetic signals to the proximate sniffer devices 110. In general, the RF antenna 702 is configured for transmitting the real-time data to the proximate sniffer device 110.

The mechanical switch 704 is configured to registering the RF device 112 with the proximate sniffer device 110. When a new RF device 112 is deployed in the connection network of the plant, the new RF device 112 has to register with the proximate sniffer device 110. For this registration, the user has to physically press and hold the mechanical switch 704 at the new RF device 112 till the RF device 112 wakes up and sends a registration initiation signal via the RF antenna 702 to the proximate sniffer device 110. Upon receiving such registration initiation signal from the new RF device 112, the proximate sniffer device 110 registers the new RF device 112 in the sniffer database 608 and transmits a registration successful signal to the new RF device 112. The registration process is a one-time procedure. Thus, the mechanical switch 704 is used during the registration of every new RF device(s) 112 with the proximate sniffer device 110.

The RF chip 706 includes a signal processing unit 708, a memory 710, a transceiver unit 712 and a power source unit 714. The signal processing unit 708 is configured for inducing electromagnetic signals or electrical signals in a specified pattern based on the type of signal received by the RF device 112. The specified pattern may be pre-stored in the memory 710. A field operator may also define the specified signal pattern or alternatively the signal processing unit 708 may define the specified signal pattern based on number of conductors within each electrical cable/wire(s). For example, if the RF antenna 702 has received an electromagnetic signal, the signal processing unit 708 may induce an electrical signal in a specified pattern to be transmitted to other RF device 112. If the RF device 112 has received the electrical signal, then the signal processing unit 708 may induce an electromagnetic signal, such as the second electromagnetic signal, to be transmitted to the proximate sniffer device 110. This is the usual scenario when both the RF devices at each end of the electrical cable/wire(s) 502 are active. In another embodiment, where either one of the RF devices 112 are faulty, then the signal processing unit 708 of the active RF device 112 is configured for inducing an electromagnetic signal, for example, the third electromagnetic signal, to be transmitted to the proximate sniffer device 110 in response to the received electro-magnetic signal, for example, the first electromagnetic signal.

In an embodiment, the signal processing unit 708 is further configured to determine if the electrical signal has been successfully received by the RF device 112 at the other end of the electrical cable/wire(s) 502. In case, it is determined that the RF device 112 at the other end of the electrical cable/wire(s) 502 has not received the electrical signal, the signal processing unit 708 is further configured to generate a third electromagnetic signal including the signal receipt failure message. This generated third electromagnetic signal is then transmitted to the proximate sniffer device 110 via the RF antenna 702.

The memory 710 is configured to store the electromagnetic signals received from the proximate sniffer devices 110. Further, the memory is configured to store the RF device IDs mapped to the respective electrical cable/wire(s) IDs. Further, the memory is configured to store the specified signal pattern of the electrical energy. The transceiver unit 712 is configured for transmitting and receiving electrical signals between the RF devices 112. The power source 714 is configured for powering up the RF devices 112 and converting the received electromagnetic signal to the electrical power in communication with the signal processing unit 708. The power source 714 may receive the electromagnetic signal from the RF antenna 702 and convert the electromagnetic signal into electric energy. The electric energy may be used to power the non-volatile memory, for example, memory 710.

In an exemplary method of operation, considering the two RF devices, for example first RF device 112a1 and the second RF device 112a2 attached to the same electrical cable/wire(s) 502, the RF antenna 702 of the first RF device 112a1 at first end of the electrical cable/wire(s) 502 outputs the received first electromagnetic signal to the RF chip 706. This first electromagnetic signal is then fed into the signal processing unit 708 and the power source 714 of the RF chip 706 as an input. The power source 714 is configured for powering up the RF device 112a1 upon receiving the first electromagnetic signal. The signal processing unit 708 is then configured for inducing the electrical signal in a specified pattern. This induced electrical signal is inputted to the transceiver unit 712 for passing the electrical signal through the electrical cable/wire(s) 502 to the second RF device 112a2 at other end of the electrical cable/wire(s) 502.

At the second RF device 112a2, the transceiver unit 712 receives the electrical signal from the first RF device 112a1 and inputs the electrical signal to the signal processing unit 708 of the second RF device 112a2. The signal processing unit 708 generates the second electromagnetic signal based on the electrical signal and transmits the second electromagnetic signal to the sniffer device 110 via the RF antenna 702.

In any case, if either of the two RF devices 112 does not receive the electrical signal transmitted via the electrical cable/wire(s) 502, the signal processing unit 708 of the active RF device, either 112a1 or 112a2 generates the third electromagnetic signal and transmits this signal to the proximate sniffer device 110 in the manner as described above.

Figure 8:
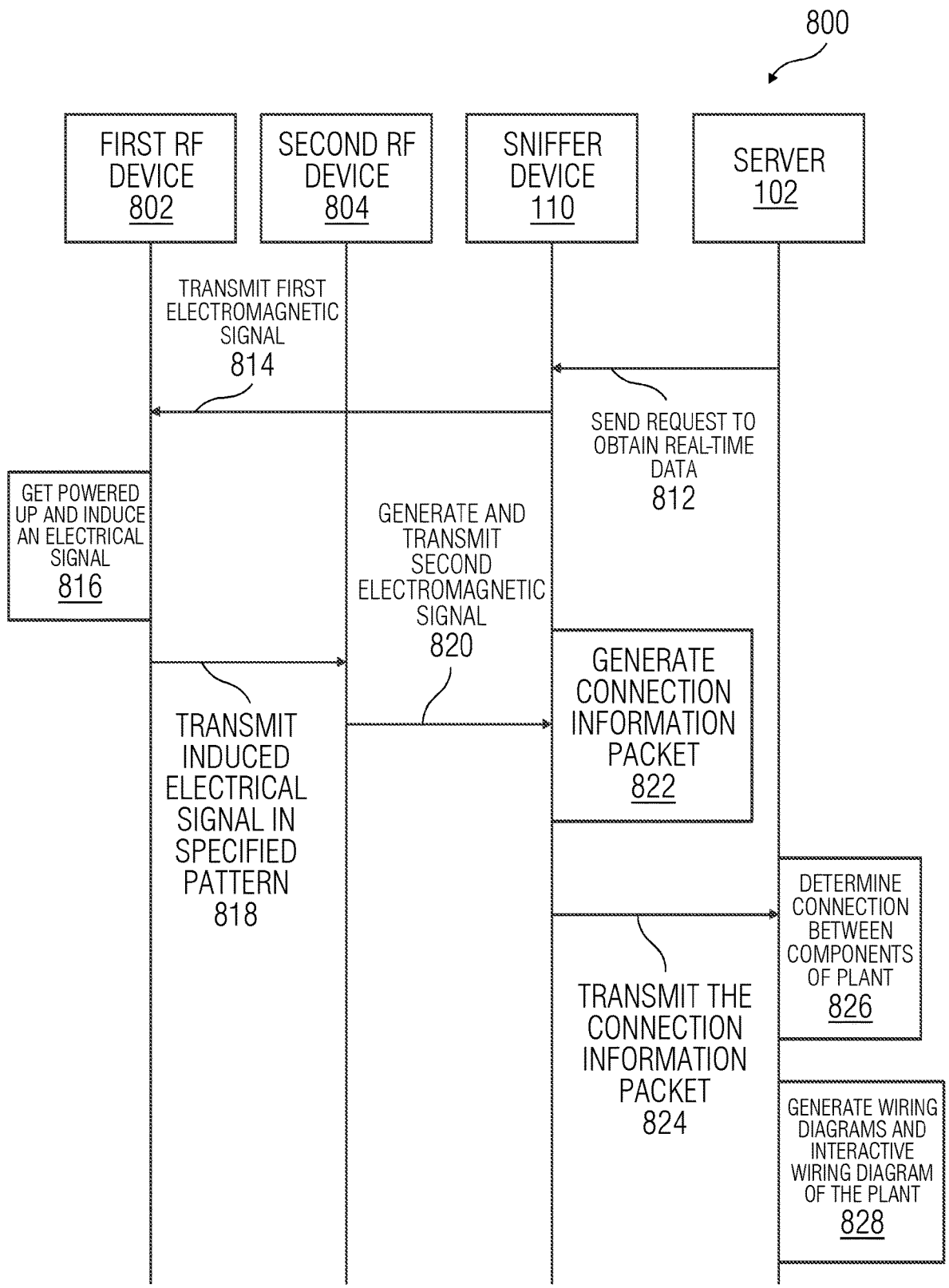
FIG. 8—is a process flow diagram illustrating an exemplary method of dynamically generating interactive wiring diagrams of the plant, according to an embodiment.

FIG. 8 is a process flow diagram 800 illustrating an exemplary method of dynamically generating interactive wiring diagrams of the plant, according to an embodiment. The flow diagram 800 depicts the communication between a first RF device 802, a second RF device 804, a sniffer device 110, and a server 102 or an engineering station 102. The first RF device 802 and the second RF device 804 may be attached to the same electrical cable/wire(s) 502. The first RF device 802 and the second RF device 804 may be assumed to be active in this scenario. With this assumption, at step 812, the server 102 sends a request to obtain real-time data associated with devices commissioned in the plant to the sniffer device 110. Upon receiving the request, at step 814, the sniffer device 110 transmits a first electromagnetic signal to the first RF device 802 in order to capture the real-time data. Upon receiving the first electromagnetic signal from the sniffer device 110, at step 816, the first RF device 802 gets powered up and induces an electrical signal. At step 818, the first RF device 802 transmits the induced electrical signal to the second RF device 804 in a specified pattern. At step 820, the second RF device 804 receives the electrical signal from the first RF device 802, generates a second electromagnetic signal which is then transmitted to the sniffer device 110. This second electromagnetic signal includes the real-time data of the electrical cable/wire(s) 502 to which the two RF devices, 802 and 804 are attached. At step 822, the sniffer device 110 receives the second electromagnetic signal from the second RF device 804 and generates a connection information packet based on the second electromagnetic signal. The connection information packet includes the real-time data required by the server 102. The real-time data may include device information and device connectivity status information. At step 824, the sniffer device 110 transmits the generated connection information packet to the server 102. At step 826, the server 102 determines the connections between the various components of the plant based on the connection information packet and the look up table. At step 828, the server 102 generates the wiring diagrams of the plant based on the determined connections and dynamically generates interactive wiring diagram by superimposing the wiring diagram with the device connectivity status information associated with respective connections between the devices.

FIG. 9 is a process flowchart 900 illustrating an exemplary method of receiving real-time data of the plant from the one or more sniffer devices 110 by the server 102 via the communication network 104, according to an embodiment. In specific, the method steps describe the process followed by the one or more sniffer devices 110 in order to acquire the real-time data from the one or more RF devices 112. Accordingly, at step 902, a request for acquiring real-time data is received from the server 102. At step 904, one or more handshake signals are generated based on the request. The one or more handshake signals are also referred to the first electromagnetic signal. At step 906, the one or more handshake signals are wirelessly transmitted to the one or more RF devices 112 using a radio frequency communication channel. At step 908, a response containing the real-time data of the plant is received from the one or more RF devices 112. At step 910, real-time data, such as real-time connection information and real-time connection status information of the plant is determined based on the response. At step 912, a connection information packet is generated based on the determined real-time connection information and real-time connection status information of the plant. The connection information packet includes control panel ID, sniffer device ID, electrical cable/wire(s) ID, RF device ID, connection status of the electrical cable/wire(s) 502, RF device 112 status, and process values for each electrical cable/wire(s) 502. At step 914, the connection information packet is transmitted to the server 102 via the communication network 104.

The present disclosure can take a form of a computer program product comprising program modules accessible from computer-usable or computer-readable medium storing program code for use by or in connection with one or more computers, processors, or instruction execution system. For the purpose of this description, a computer-usable or computer-readable medium can be any apparatus that can contain, store, communicate, propagate, or transport the program for use by or in connection with the instruction execution system, apparatus, or device. The medium can be electronic, magnetic, optical, electromagnetic, infrared, or semiconductor system (or apparatus or device) or a propagation mediums in and of themselves as signal carriers are not included in the definition of physical computer-readable medium include a semiconductor or solid state memory, magnetic tape, a removable computer diskette, random access memory (RAM), a read only memory (ROM), a rigid magnetic disk and optical disk such as compact disk read-only memory (CD-ROM), compact disk read/write, and DVD. Both processors and program code for implementing each aspect of the technology can be centralized or distributed (or a combination thereof) as known to those skilled in the art.

While the present disclosure has been described in detail with reference to certain embodiments, it should be appreciated that the present disclosure is not limited to those embodiments. In view of the present disclosure, many modifications and variations would be present themselves, to those skilled in the art without departing from the scope of the various embodiments of the present disclosure, as described herein. The scope of the present disclosure is, therefore, indicated by the following claims rather than by the foregoing description. All changes, modifications, and variations coming within the meaning and range of equivalency of the claims are to be considered within their scope.

All advantageous embodiments claimed in method claims may also be apply to system/apparatus claims.

The invention claimed is:

1. A method for automatically generating an interactive wiring diagram in an industrial automation environment, the method comprising:
    acquiring, by a processor, real-time data associated with devices commissioned in a plant from one or more sensing units disposed at the respective devices using a radio frequency identifier, wherein the real-time data comprises device information and device connectivity status information;
    determining connections between the devices in the plant based on the acquired real-time data using a lookup table;
    generating a wiring diagram of the plant based on the determined connections between the devices, wherein the wiring diagram represents the devices located in the plant and physical connections between the devices;
    dynamically generating the interactive wiring diagram, dynamically generating the interactive wiring diagram comprising superimposing the wiring diagram with the device connectivity status information associated with respective connections between the devices;
    identifying a fault in at least one connection in the plant based on the device connectivity status information of the at least one connection;
    determining a location of the fault in the at least one connection based on the device information; and
    computing at least one solution to rectify the fault in the at least one connection.

2. The method of claim 1, further comprising:
    displaying the interactive wiring diagram of the plant superimposed with the device connectivity status information on a graphical user interface.

3. The method of claim 1, further comprising:
    generating an alert indicating that the fault exists in the at least one connection; and
    displaying the fault in the at least one connection on the interactive wiring diagram of the plant, wherein the interactive wiring diagram displays the location of the fault and the at least one solution for rectifying the fault.

4. The method of claim 1, wherein determining the connections between the devices in the plant based on the acquired real-time data comprises:
    selecting a source device from the devices commissioned in the plant based on the device information;
    determining a target device connected to the source device using the lookup table; and
    determining the connection between the source device and the target device based on the real time data and the lookup table.

5. The method of claim 1, wherein acquiring the real-time data associated with the devices commissioned in the plant from the one or more sensing units disposed at the respective devices comprises:
    sending a request to the one or more sensing units disposed at the respective devices for providing real-time data associated with the respective devices via a wireless network; and
    receiving a response from the one or more sensing units, wherein the response comprises the real-time data associated with the respective devices.

6. An apparatus for automatically generating an interactive wiring diagram in an industrial automation environment, the apparatus comprising:

a processor; and a memory coupled to the processor, wherein the memory comprises an automation module stored in the form of machine-readable instructions executable by the processor, the instructions comprising:

acquiring real-time data associated with devices commissioned in a plant from one or more sensing units disposed at respective devices, wherein the real-time data comprises device information and device connectivity status information;

determining connections between the respective devices in the plant based on the acquired real-time data using a lookup table;

generating a wiring diagram of the plant based on the determined connections between the devices, wherein the wiring diagram represents the devices located in the plant and physical connections between the devices;

dynamically generating the interactive wiring diagram, dynamically generating the interactive wiring diagram comprising superimposing the wiring diagram with the device connectivity status information associated with respective connections between the devices;

identifying a fault in at least one connection in the plant based on the device connectivity status information of the at least one connection;

determining a location of the fault in the at least one connection based on the device information; and computing at least one solution to rectify the fault in the at least one connection.

7. The apparatus of claim 6, wherein the instructions further comprise:

displaying the interactive wiring diagram of the plant superimposed with the device connectivity status information on a graphical user interface.

8. The apparatus of claim 6, wherein the instructions further comprise:

generating an alert indicating that the fault exists in the at least one connection; and displaying the fault in the at least one connection on the interactive wiring diagram of the plant, wherein the interactive wiring diagram displays the location of the fault and the at least one solution for rectifying the fault.

9. The apparatus of claim 6, wherein determining the connections between the devices in the plant based on the acquired real-time data comprises:

selecting a source device from the devices commissioned in the plant based on the device information;

determining a target device connected to the source device using the lookup table; and determining the connection between the source device and the target device based on the real time data and the lookup table.

10. The apparatus of claim 6, wherein acquiring the real-time data associated with the devices commissioned in the plant from the one or more sensing units disposed at the respective devices comprises:

sending a request to the one or more sensing units disposed at the respective devices for providing real-time data associated with the respective devices via a wireless network; and receiving a response from the one or more sensing units, wherein the response comprises the real-time data associated with the respective devices.

11. A plant comprising:

one or more devices;

one or more sensing units coupled to the one or more devices, the one or more sensing unit being configured to:

capture real-time data associated with the one or more devices, wherein the real-time data comprises device information and device connectivity status information; and an automation module communicatively coupled to the one or more sensing units, wherein the automation module is configured to:

acquire the real-time data associated with the one or more devices from the one or more sensing units coupled to the respective devices, wherein the real-time data comprises device information and device connectivity status information;

determine connections between the one or more devices in the plant based on the acquired real-time data using a lookup table;

generate a wiring diagram of the plant based on the determined connections between the one or more devices, wherein the wiring diagram represents the devices located in the plant and physical connections between the devices;

dynamically generate the interactive wiring diagram, dynamic generation of the interactive wiring diagram comprising superimposition of the wiring diagram with the device connectivity status information associated with respective connections between the devices;

identify a fault in at least one connection in the plant based on the device connectivity status information of the at least one connection;

determine a location of the fault in the at least one connection based on the device information; and compute at least one solution to rectify the fault in the at least one connection.

12. A cloud computing system comprising:

one or more processors connectable to one or more sensing units, the one or more sensing units being coupled to one or more devices in a plant via a gateway; and a memory unit coupled to the one or more processors, wherein the memory unit comprises an automation module stored in the form of machine-readable instructions executable by the one or more processors to automatically generate an interactive wiring diagram in an industrial automation environment, the automation module being configured to:

acquire real-time data associated with devices commissioned in a plant from one or more sensing units disposed at the respective devices, wherein the real-time data comprises device information and device connectivity status information;

determine connections between the devices in the plant based on the acquired real-time data using a lookup table;

generate a wiring diagram of the plant based on the determined connections between the devices, wherein the wiring diagram represents the devices located in the plant and physical connections between the devices;

dynamically generate the interactive wiring diagram, the dynamic generation of the interactive wiring diagram comprising superimposition of the wiring diagram with the device connectivity status information associated with respective connections between the devices;

identify a fault in at least one connection in the plant based on the device connectivity status information of the at least one connection;

determine a location of the fault in the at least one connection based on the device information; and compute at least one solution to rectify the fault in the at least one connection.

13. A non-transitory computer-readable storage medium storing instructions executable by at least one processor to automatically generate an interactive wiring diagram in an industrial automation environment, the instructions comprising:

acquiring real-time data associated with devices commissioned in a plant from one or more sensing units disposed at the respective devices, wherein the real-time data comprises device information and device connectivity status information;

determining connections between the devices in the plant based on the acquired real-time data using a lookup table;

generating a wiring diagram of the plant based on the determined connections between the devices, wherein the wiring diagram represents the devices located in the plant and physical connections between the devices;

dynamically generating the interactive wiring diagram, dynamically generating the interactive wiring diagram comprising superimposing the wiring diagram with the device connectivity status information associated with respective connections between the devices;

identifying a fault in at least one connection in the plant based on the device connectivity status information of the at least one connection;

determining a location of the fault in the at least one connection based on the device information; and computing at least one solution to rectify the fault in the at least one connection.

14. The non-transitory computer-readable storage medium of claim 13, wherein the instructions further comprise:

displaying the interactive wiring diagram of the plant superimposed with the device connectivity status information on a graphical user interface.

15. The non-transitory computer-readable storage medium of claim 13, wherein the instructions further comprise:

generating an alert indicating that the fault exists in the at least one connection; and displaying the fault in the at least one connection on the interactive wiring diagram of the plant, wherein the interactive wiring diagram displays the location of the fault and the at least one solution for rectifying the fault.

16. The non-transitory computer-readable storage medium of claim 13, wherein determining the connections between the devices in the plant based on the acquired real-time data comprises:

selecting a source device from the devices commissioned in the plant based on the device information;

determining a target device connected to the source device using the lookup table; and determining the connection between the source device and the target device based on the real time data and the lookup table.

17. The non-transitory computer-readable storage medium of claim 13, wherein acquiring the real-time data associated with the devices commissioned in the plant from the one or more sensing units disposed at the respective devices comprises:

sending a request to the one or more sensing units disposed at the respective devices for providing real-time data associated with the respective devices via a wireless network; and receiving a response from the one or more sensing units, wherein the response comprises the real-time data associated with the respective devices.

* * * * *